(12) United States Patent
Nakagawa et al.

(10) Patent No.: US 10,079,590 B2
(45) Date of Patent: Sep. 18, 2018

(54) VIBRATOR ELEMENT, ELECTRONIC DEVICE, ELECTRONIC APPARATUS, MOVING OBJECT, AND METHOD OF MANUFACTURING VIBRATOR ELEMENT

(71) Applicant: SEIKO EPSON CORPORATION, Tokyo (JP)

(72) Inventors: Keiji Nakagawa, Minowa-machi (JP); Ryuta Nishizawa, Matsumoto (JP); Atsushi Matsuo, Okaya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 282 days.

(21) Appl. No.: 14/885,646

(22) Filed: Oct. 16, 2015

(65) Prior Publication Data

US 2016/0126923 A1    May 5, 2016

(30) Foreign Application Priority Data

Oct. 29, 2014 (JP) ................. 2014-220038

(51) Int. Cl.
*H03H 9/21* (2006.01)
*H03H 3/02* (2006.01)
*G01C 19/5607* (2012.01)

(52) U.S. Cl.
CPC ........... *H03H 9/21* (2013.01); *G01C 19/5607* (2013.01); *H03H 3/02* (2013.01); *H03H 2003/026* (2013.01)

(58) Field of Classification Search
CPC ........ H03H 9/21; H03H 9/215; H03H 9/2473; H03H 9/2484; H03H 9/2494; H03H 2003/026; H03H 2003/0492; G01C 19/5607
USPC ........................................................ 310/370
See application file for complete search history.

(56) References Cited

U.S. PATENT DOCUMENTS

| | | | | |
|---|---|---|---|---|
| 9,083,307 | B2 * | 7/2015 | Nishizawa | H03H 3/02 |
| 9,748,922 | B2 * | 8/2017 | Ishino | H03H 9/21 |
| 2004/0085163 | A1 * | 5/2004 | Kikushima | G01C 19/5607 333/200 |
| 2005/0122006 | A1 * | 6/2005 | Matsudo | G01C 19/5607 310/370 |
| 2007/0068251 | A1 | 3/2007 | Yamamoto | |
| 2010/0084948 | A1 * | 4/2010 | Katoh | G01C 19/5607 310/367 |

(Continued)

FOREIGN PATENT DOCUMENTS

| | | |
|---|---|---|
| JP | H05-77717 A | 3/1993 |
| JP | H05-77717 U | 10/1993 |

(Continued)

*Primary Examiner* — J. San Martin
(74) *Attorney, Agent, or Firm* — Oliff PLC

(57) ABSTRACT

A vibrator element includes drive vibrating arms extending from an end of a base section, the drive vibrating arms are each provided with an obverse surface, a reverse surface disposed on an opposite side to the obverse surface, and a side surface connecting the obverse surface and the reverse surface to each other, a tilted section facing toward the obverse surface is disposed at least a part of the side surface, and there are disposed a first drive electrode and a second drive electrode obtained by bisection with an electrode separation section disposed in the tilted section.

18 Claims, 10 Drawing Sheets

(56) References Cited

U.S. PATENT DOCUMENTS

| | | | |
|---|---|---|---|
| 2010/0200543 A1* | 8/2010 | Katoh | H03H 3/02 |
| | | | 216/41 |
| 2011/0227658 A1* | 9/2011 | Tanaya | H03H 9/0504 |
| | | | 331/156 |
| 2012/0326570 A1 | 12/2012 | Nishizawa et al. | |
| 2013/0205898 A1* | 8/2013 | Nakagawa | G01C 19/5621 |
| | | | 73/504.16 |
| 2013/0283910 A1 | 10/2013 | Nishizawa et al. | |
| 2016/0028370 A1* | 1/2016 | Nakagawa | H03H 3/02 |
| | | | 310/370 |

FOREIGN PATENT DOCUMENTS

| | | |
|---|---|---|
| JP | H06-201387 A | 7/1994 |
| JP | H08-261766 A | 10/1996 |
| JP | 2003-315048 A | 11/2003 |
| JP | 2006-184176 A | 7/2006 |
| JP | 2007-064662 A | 3/2007 |
| JP | 2013-009166 A | 1/2013 |
| JP | 2013-205326 A | 10/2013 |
| JP | 2013-231635 A | 11/2013 |

\* cited by examiner

VIBRATOR ELEMENT, ELECTRONIC DEVICE, ELECTRONIC APPARATUS, MOVING OBJECT, AND METHOD OF MANUFACTURING VIBRATOR ELEMENT

BACKGROUND

1. Technical Field

The present invention relates to a vibrator element, and an electronic device, an electronic apparatus, and a moving object using the vibrator element, and a method of manufacturing the vibrator element.

2. Related Art

For small-sized information equipment such as a mobile computer or an IC card, mobile communication equipment such as a cellular phone, and vehicle control and a vehicle position detection, a vibration control correction function (so-called image stabilization) for digital cameras or digital video camera, and so on, vibrators using a vibrator element and gyro sensors are used widely. For example, the gyro sensor detects an electric signal, which is generated in a part of a gyro vibrator element (a gyro vibrating element) due to a vibration such as a tremor or a rotation of an object, as an angular velocity using the gyro vibrating element, and then obtains the displacement of the object by calculating the rotational angle.

In the gyro sensor, there is widely used the gyro element formed of a piezoelectric material such as quartz crystal (see, e.g., JP-A-2006-184176 (Document 1)). The vibrator element (vibrating element) described in Document 1 is a so-called H-type gyro element including a base section made of quartz crystal, a pair of detection vibrating arms and a pair of drive vibrating arms each extending from respective end portions of the base section in parallel to each other. The detection vibrating arms of the gyro element are each provided with a through hole. Further, on each of two side surfaces of the through hole and two side surfaces (outer side surfaces) of the detection vibrating arm, there are disposed detection electrodes separated from each other.

In the gyro element as the vibrator element described above, the detection electrodes separated from each other are formed each of the two side surfaces of the through hole and the two side surfaces (the outer surfaces) of the detection vibrating arm formed so as to be roughly perpendicular to the obverse and reverse surfaces of the detection vibrating arm. The detection electrodes separated from each other can easily be formed using, for example, a photolithography method. However, since the electrode film to be divided is disposed on the side surface formed roughly perpendicularly to the obverse and reverse surfaces of such a detection vibrating arm as described above, it has been difficult to use a simple manufacturing device such as a so-called plane exposure device for irradiating the obverse and reverse surfaces of the detection vibrating arm with light in a vertical direction in the exposure process for forming separation sections.

SUMMARY

An advantage of some aspects of the invention is to solve at least a part of the problems described above, and the invention can be implemented as the following aspects and application examples.

Application Example 1

A vibrator element according to this application example includes a base section, and at least one vibrating arm extending from the base section, the vibrating arm includes an obverse surface, a reverse surface on an opposite side to the obverse surface, grooves provided respectively to the obverse surface and the reverse surface, side surface electrodes disposed on at least one side surface adapted to connect the obverse surface and the reverse surface to each other, and groove electrodes provided to the grooves, at least a part of the side surface has a tilted section facing toward the obverse surface and exposed in a planar view viewed from the obverse surface side, and the side surface electrodes are separated from each other in the tilted section.

According to this application example, the tilted section of the vibrating arm in which the separation section is disposed is exposed toward the obverse surface in the planar view viewed from the obverse surface side, and the side surface electrodes are separated from each other in the tilted section. Therefore, if the so-called plane exposure of applying the light for the exposure toward the plane direction (the obverse and reverse surfaces) of the vibrating arm is used in the exposure for separating the electrodes from each other, it is possible to easily irradiate the tilted section with the light. As described above, in the exposure of the tilted section, it is possible to irradiate the tilted section with the parallel light from the same direction, in other words, to use the plane exposure. Therefore, it becomes possible to use a simple device using the plane exposure, and it is possible to easily perform the exposure (resist exposure) for separating the electrodes from each other.

Application Example 2

In the vibrator element according to the application example described above, it is preferable that the vibrating arms include at least one drive vibrating arm and at least one detection vibrating arm, and the detection vibrating arm is provided with detection electrodes as the side surface electrodes and the groove electrodes.

According to this application example, the separation of the detection electrodes disposed on the detection vibrating arm extending from the one end of the base section can easily be achieved in the tilted section.

Application Example 3

In the vibrator element according to the application example described above, it is preferable that the detection vibrating arm extends from one end of the base section, and the drive vibrating arm extends from the other end located on an opposite side to the one end of the base section in the planar view viewed from the obverse surface side.

According to this application example, there is disposed the drive vibrating arm extending from the base section on the opposite side to the detection vibrating arm. Since the drive vibrating arm and the detection vibrating arm respectively extend from the both end portions of the base section in the same axis direction, the drive system and the detection system are separated from each other to thereby reduce the capacitive coupling between the electrodes or the wiring lines of the drive system and the detection system, and thus, the detection sensitivity of the angular velocity can be stabilized.

Application Examples 4 and 5

In the vibrator element according to the application example described above, it is preferable that there are further included a pair of adjusting vibrating arms extending from the base section and located on both sides of one of the detection vibrating arm and the drive vibrating arm.

According to these application examples, by controlling the charge in the adjusting vibrating arm disposed in addition to the application examples described above and adapted to control the leakage output, it is possible to cancel out the charge of the leakage vibration to thereby suppress the vibration leakage output. As a result, it becomes possible to stabilize the vibration characteristics.

Application Examples 6 and 7

In the vibrator element according to the application example described above, it is preferable that there is further included a large-width section disposed on one end of at least one of the drive vibrating arm and the detection vibrating arm, which is connected to the base section at the other end on the opposite side to the one end.

According to these application examples, since predetermined drive vibration and detection vibration are obtained while preventing the increase in the length of the drive vibrating arm and the detection vibrating arm, and at the same time, the adjustment range for suppressing the leakage vibration can be broadened, it is possible to provide the vibrator element, which is small in size and has highly sensitive characteristics.

Application Examples 8 and 9

In the vibrator element according to the application example described above, it is preferable that there is further included a large-width section disposed on one end of at least one of the drive vibrating arm, the detection vibrating arm, and the adjusting vibrating arm, which is connected to the base section at the other end on the opposite side to the one end.

According to these application examples, since predetermined drive vibration and detection vibration are obtained while preventing the increase in the length of the drive vibrating arm, the detection vibrating arm, and the adjusting vibrating arm, and at the same time, the adjustment range for suppressing the leakage vibration can be broadened, it is possible to provide the vibrator element, which is small in size and has highly sensitive characteristics.

Application Example 10

A method of manufacturing a vibrator element according to this application example includes providing a base section, at least one vibrating arm extending from the base section, grooves provided respectively to an obverse surface and a reverse surface located on an opposite side to the obverse surface, side surface electrodes disposed on at least one side surface adapted to connect the obverse surface and the reverse surface to each other, and groove electrodes provided to the grooves, forming an outer shape of the vibrator element having at least a part of the side surface including a tilted section facing toward the obverse surface in a planar view viewed from the obverse surface side, forming the grooves on the obverse surface and the reverse surface, forming a groove electrode film in each of the grooves and a side surface electrode film on the side surface, and dividing the side surface electrode film formed on the tilted section and dividing the groove electrode film formed in each of the grooves, and the dividing includes applying light from the obverse surface side.

According to this application example, the vibrating arm includes the grooves provided respectively to the obverse surface and the reverse surface located on the opposite side to the obverse surface, the side surface electrodes disposed on the side surface adapted to connect the obverse surface and the reverse surface to each other, and the groove electrodes provided to the grooves. Further, there is provided the outer circumferential shape in which the tilted section exposed toward the obverse surface is included in at least a part of the side surface. Further, in the dividing, the side surface electrode film is divided inside the tilted section, and the groove electrode film is divided inside the groove. Since the side surface electrode film is divided inside the tilted section as described above, if the so-called plane exposure of applying the light for the exposure toward the plane direction (the obverse and reverse surfaces) of the vibrating arm is used in the applying of light as a part of the dividing, it is possible to easily irradiate the tilted section with the light. Further, at the same time, the inside of the groove can easily be irradiated with the light by the plane exposure. As described above, it becomes possible to use the simple device using the plane exposure of irradiating the tilted section with the parallel light from the same direction in the exposure including the tilted section, and it is possible to easily perform the exposure (resist exposure) for separating the electrodes from each other.

Application Example 11

In the method of manufacturing a vibrator element according to the application example described above, it is preferable that the forming of an outer shape includes forming the outer shape using a dry etching method.

According to this application example, the tilted section of the vibrating arm can be formed using the dry etching method at the same time as forming the outer shape of the vibrator element in the forming of an outer shape. Thus, the tilted section of the vibrating arm can easily be formed without providing an additional process.

Application Examples 12, 13, and 14

An electronic device according to each of these application examples includes the vibrator element according to any one of the application examples described above, an electronic component including at least a drive circuit adapted to excite the vibrating arm, and a package adapted to house at least one of the vibrator element and the electronic component.

According to these application examples, the electronic device equipped with the vibrator element having an advantage described in either one of the application examples described above can be obtained. In addition, the package type electronic device having the configuration described above is advantageous to the miniaturization and thickness reduction, and at the same time, has an improved impact resistance.

Application Examples 15, 16, and 17

An electronic apparatus according to each of these application examples includes the vibrator element according to any one of the application examples described above.

According to these application examples, since there is provided the vibrator element according to any one of the application examples described above in which the electrode separation can easily be achieved, namely the cost reduction is achieved, the low-cost electronic apparatus can be provided. Further, since the electronic device is equipped with the highly sensitive vibrator element on which the adjustment for suppressing the leakage output is performed, the electronic device, which is highly functional, and has stable characteristics, can be provided.

Application Examples 18, 19, and 20

A moving object according to each of these application examples includes the vibrator element according to any one of the application examples described above.

According to these application examples, since there is provided the vibrator element according to any one of the application examples described above in which the electrode separation can easily be achieved, namely the cost reduction is achieved, the low-cost moving object can be provided. Further, since the electronic device is equipped with the highly sensitive vibrator element on which the adjustment for suppressing the leakage output is performed, the moving object, which is highly functional, and has stable characteristics, can be provided.

BRIEF DESCRIPTION OF THE DRAWINGS

The invention will be described with reference to the accompanying drawings, wherein like numbers reference like elements.

FIGS. 1A and 1B are diagrams showing a general configuration of a tuning fork vibrating element as an example of the vibrator element according to a first embodiment of the invention, wherein FIG. 1A is a plan view, and FIG. 1B is a cross-sectional view along the A-A line in FIG. 1A.

FIGS. 2A and 2B are diagrams showing a general configuration of a flexural vibrating element as an example of the vibrator element according to a second embodiment of the invention, wherein FIG. 2A is a plan view, and FIG. 2B is a cross-sectional view along the B-B line in FIG. 2A.

FIGS. 3A and 3B are diagrams showing a general configuration of an H-type gyro element as an example of a vibrator element according to a third embodiment of the invention, wherein FIG. 3A is a perspective view, and FIG. 3B is a plan view.

FIGS. 5A and 5B are diagrams for explaining an electrode configuration of the gyro element according to the third embodiment, wherein FIG. 5A is a cross-sectional view along the C-C line in FIG. 3B, and FIG. 5B is a cross-sectional view along the D-D line in FIG. 3B.

FIGS. 6A and 6B are diagrams showing a general configuration of a double T-type gyro element as an example of a vibrator element according to a fourth embodiment of the invention, wherein FIG. 6A is a plan view, and FIG. 6B is a cross-sectional view along the E-E line in FIG. 6A.

DESCRIPTION OF EXEMPLARY EMBODIMENTS

Figure 1A:
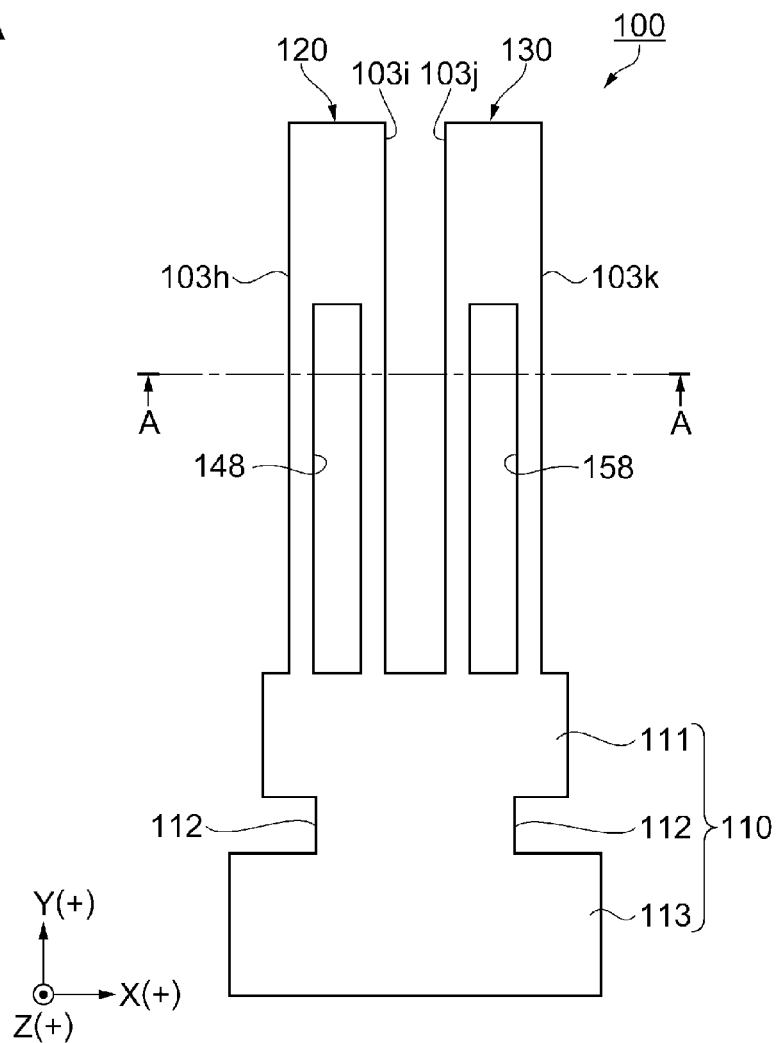

Some embodiments of the invention will hereinafter be explained with reference to the accompanying drawings. It should be noted that in each of the drawings described below, the scale sizes of the layers and the members are made different from the actual dimensions in order to make the layers and the members have recognizable dimensions. Further, in FIGS. 1A through 7D, there are shown an X axis, a Y axis, and a Z axis as three axes perpendicular to each other, and the tip side of each of the arrows shown in the drawings is defined as "+ side," and the base end side is defined as "− side" for the sake of convenience of explanation. Further, in the following explanation, a direction parallel to the X axis is referred to as an "X-axis direction," a direction parallel to the Y axis is referred to as a "Y-axis direction," and a direction parallel to the Z axis is referred to as a "Z-axis direction."

First Embodiment

Vibrator Element-1

Figure 1B:
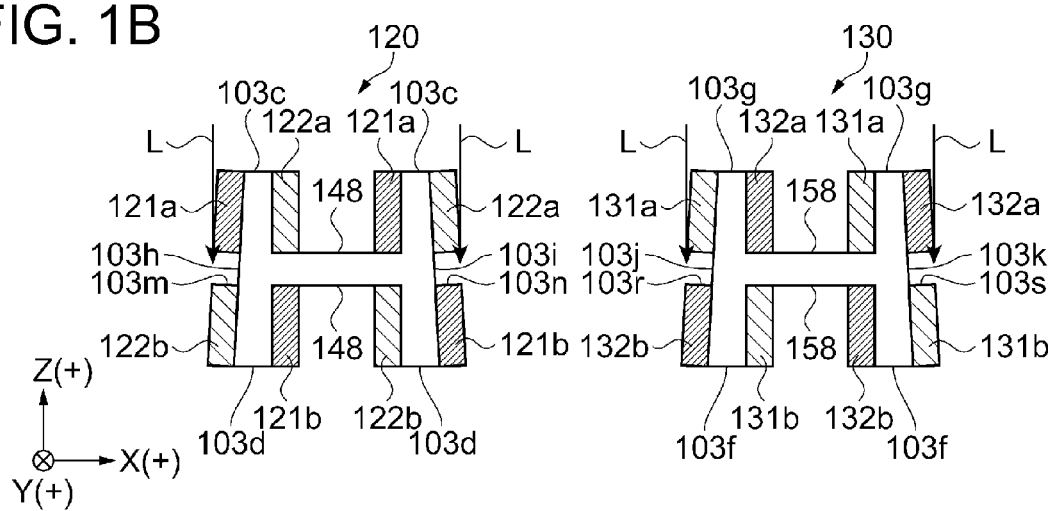

Firstly, a schematic configuration of the vibrator element according to a first embodiment will be explained using FIGS. 1A and 1B. FIG. 1A is a plan view schematically showing a general configuration of a tuning fork vibrating element as the vibrator element according to the first embodiment. FIG. 1B is a cross-sectional view along the A-A line in FIG. 1A. It should be noted that in FIG. 1A, drive electrodes are omitted for the sake of convenience of explanation.

As shown in FIGS. 1A and 1B, the tuning fork vibrating element 100 as the vibrator element is a tuning fork vibrating element provided with a base section 110, and drive vibrating arms 120, 130 as a pair of vibrating arms extending in the +Y-axis direction from the base section 110. The base section 110 has a plate-like shape provided with a narrow-width section 111 and a wide-width section 113 disposed via a constricted section 112. It should be noted that it is possible for the base section 110 to have a shape not provided with the constricted section 112, namely a roughly rectangular plate-like shape. The drive vibrating arms 120, 130 as the vibrating arms are a pair of vibrating body each having a prismatic shape, and extending from a +Y-side end of the narrow-width section 111 of the base section 110 in the Y-axis direction in parallel to each other. The base section 110 and the drive vibrating arms 120, 130 constituting the tuning fork vibrating element 100 are formed integrally with each other, and the quartz crystal is used as the base material of the base section 110 and the drive vibrating arms 120, 130. It should be noted that the tuning fork vibrating element 100 according to the first embodiment is formed using a photolithography method and a dry etching method using a fluorinated gas or the like.

The quartz crystal has an X axis called an electrical axis, a Y axis called a mechanical axis, and a Z axis called an optical axis. The base material constituting the tuning fork vibrating element 100 is carved out along a plane defined by the X axis and the Y axis perpendicular to each other in the crystal axes of the quartz crystal, then processed to have a plate-like shape, and therefore has a predetermined thickness in the Z-axis direction perpendicular to the plane. As the Z axis, it is possible to use one carved out after being rotated in a range of 0 through 2 degrees around the X axis. The predetermined thickness is appropriately set in accordance with the oscillation frequency, the outside dimensions, the workability, and so on.

The drive vibrating arm 120 and the drive vibrating arm 130 as the vibrating arms vibrate along an out-of-plane direction (the Z-axis direction) perpendicular to the plane defined by the X axis and the Y axis in respective directions opposite to each other. In other words, when the drive vibrating arm 120 is displaced toward the +Z-axis direction, the drive vibrating arm 130 is displaced toward the −Z-axis direction, and when the drive vibrating arm 120 is displaced toward the −Z-axis direction, the drive vibrating arm 130 is displaced toward the +Z-axis direction.

The drive vibrating arm 120 extending from the base section 110 is provided with an obverse surface 103c, a reverse surface 103d disposed on the opposite side to the obverse surface 103c, and side surfaces 103h, 103i connecting the obverse surface 103c and the reverse surface 103d to each other. Further, the drive vibrating arm 130 extending from the base section 110 is provided with an obverse surface 103g, a reverse surface 103f disposed on the opposite side to the obverse surface 103g, and side surfaces 103j, 103k connecting the obverse surface 103g and the reverse surface 103f to each other. Further, the drive vibrating arm 120 is provided with recessed sections (grooves) 148 each having a bottom, which are dug respectively from the obverse surface 103c and the reverse surface 103d, and extend along the Y-axis direction. Further, the drive vibrating arm 130 is provided with recessed sections (grooves) 158 each having a bottom, which are dug respectively from the obverse surface 103g and the reverse surface 103f, and extend along the Y-axis direction.

The side surfaces 103h, 103i, 103j, and 103k of the drive vibrating arms 120, 130 are configured as tilted sections so that the side surfaces 103h, 103i, 103j, and 103k turn toward the obverse surfaces 103c, 103g in a planar view of viewing the drive vibrating arms 120, 130 from the obverse surfaces 103c, 103g side. In other words, the side surfaces 103h, 103i, 103j, and 103k are arranged to be surfaces exposed toward the obverse surfaces 103c, 103g when viewed from the obverse surface 103c, 103g side. As described above, in the cross-sectional surfaces of the drive vibrating arms 120, 130, the side surfaces 103h, 103i, 103j, and 103k form the tilted sections so as to form a trapezoidal shape shown in FIG. 1B. Further, electrode separation sections (separation lines) 103m, 103n, 103r, and 103s for separating the first drive electrodes 121a, 121b, 132a, and 132b and the second drive electrodes 122a, 122b, 131a, and 131b as the side surface electrodes described later from each other are disposed on the tilted sections of the side surfaces 103h, 103i, 103j, and 103k.

Although the details will be explained in the latter part, by adopting such a configuration of the drive vibrating arms 120, 130, in the exposure process in forming the electrode separation sections 103m, 103n, 103r, and 103s and so on, if there is used the so-called plane exposure of irradiating the obverse surfaces 103c, 103g and the reverse surfaces 103d, 103f of the drive vibrating arms 120, 130 with the light for the exposure, it is possible to easily irradiate the tilted sections in addition to the recessed sections (the grooves) 148, 158 as the plane sections with the light. In other words, it is possible to directly irradiate the tilted sections to be provided with the electrode separation sections (the separation lines) 103m, 103n, 103r, and 103s with the irradiation light L for the exposure. As described above, in the exposure of the tilted sections, it is possible to use the plane exposure of irradiating the tilted sections with the parallel light from the same direction. Therefore, by using the simple device, which uses the plane exposure, it is possible to easily perform the exposure (resist exposure) for forming the electrode separation sections 103m, 103n, 103r, and 103s for separating the first drive electrodes 121a, 121b, 132a, and 132b and the second drive electrodes 122a, 122b, 131a, 131b from each other. Further, it is possible to perform the exposure (resist exposure) for forming the electrode separation sections (not shown) between the first drive electrodes 121a, 121b, 132a, and 132b and the second drive electrodes 122a, 122b, 131a, 131b as the groove electrodes located inside the recessed sections (grooves) 148, 158 on the bottom surfaces of the recessed sections (grooves) 148, 158 using the simple device which uses the plane exposure. As described above, the exposure (resist exposure) for the electrode separation on the side surfaces 103h, 103i, 103j, and 103k, and in the recessed sections (the grooves) 148, 158 can easily be performed.

It should be noted that although not shown in the drawings, it is also possible for the tip portions of the drive vibrating arms 120, 130 to be respectively provided with weight sections as large-width sections, which are larger in width (larger in the dimension in the X-axis direction) than the drive vibrating arms 120, 130, respectively, and each have a roughly rectangular shape. In the configuration in which the drive vibrating arms 120, 130 are provided with the weight sections as the large-width sections, since the predetermined drive vibration can be obtained while suppressing the increase in the length (the dimension in the Y-axis direction) of the drive vibrating arms 120, 130, it becomes possible to miniaturize the tuning fork vibrating element 100.

Then, drive electrodes of the tuning fork vibrating element 100 will be explained with reference to FIG. 1B. The drive electrodes for driving the drive vibrating arms 120, 130 include the first drive electrodes 121a, 121b, 132a, and 132b, and the second drive electrodes 122a, 122b, 131a, and 131b. Although not shown in the drawings, the first drive electrodes 121a, 121b, 132a, and 132b, and the second drive electrodes 122a, 122b, 131a, and 131b are each disposed so as to extend from the bases of the drive vibrating arms 120, 130 toward the tip portions. As described above, the drive vibrating arms 120, 130 are provided with the recessed sections (the grooves) 148, 148, respectively. The recessed sections 148, 158 in the present embodiment are respectively disposed on the both surface sides, namely on the obverse surfaces 103c, 103g, and the reverse surfaces 103d, 103f. Further, as described above, the side surfaces 103h, 103i, 103j, and 103k are each formed as the tilted section tilted so as to be exposed toward the obverse surfaces 103c, 103g.

In the drive vibrating arm 120, on the side surface 103h, there are disposed the first drive electrode 121a located on the obverse surface 103c side and the second drive electrode 122b located on the reverse surface 103d side separated from each other by the electrode separation section 103m, which is located at roughly the center of the side surface 103h in the thickness direction (the Z-axis direction) of the drive vibrating arm 120, and is disposed along the extending direction (the Y-axis direction) of the drive vibrating arm 120. Further, the second drive electrode 122a is disposed on the inner side surface of the recessed section 148 opposed to the first drive electrode 121a, and the first drive electrode 121b is disposed on the inner side surface of the recessed section 148 opposed to the second drive electrode 122b. Further, on the side surface 103i located on the opposite side to the side surface 103h, there are disposed the second drive electrode 122a located on the obverse surface 103c side and the first drive electrode 121b located on the reverse surface 103d side separated from each other by the electrode separation section 103n, which is located at roughly the center of the side surface 103i in the thickness direction of the drive vibrating arm 120, and is disposed along the extending direction of the drive vibrating arm 120. Further, the first drive electrode 121a is disposed on the inner side surface of the recessed section 148 opposed to the second drive electrode 122a, and the second drive electrode 122b is disposed on the inner side surface of the recessed section 148 opposed to the first drive electrode 121b. It should be noted that the second drive electrode 122a and the first drive electrode 121a as the groove electrodes on the inner side surfaces of the recessed section 148, and the first drive electrode 121b and the second drive electrode 122b as the groove electrodes on the inner side surfaces of the recessed section 148 are separated by the respective bottom surfaces of the recessed sections 148.

Further, although not shown in the drawings, the first drive electrodes 121a and the first drive electrodes 121b are electrically connected to each other via the tip portion and so on of the drive vibrating arm 120. Similarly, although not shown in the drawings, the second drive electrodes 122a and the second drive electrodes 122b are electrically connected to each other via the tip portion and so on of the drive vibrating arm 120. It should be noted that the first drive electrodes 121a, 121b and the second drive electrodes 122a, 122b are disposed so as to extend to the vicinity of the tip of the drive vibrating arm 120. Further, the first drive electrodes 121a, 121b and the second drive electrodes 122a, 122b are electrically connected respectively to external connection pads not shown via wiring lines not shown.

Similarly, in the drive vibrating arm 130, on the side surface 103j, there are disposed the second drive electrode 131a located on the obverse surface 103g side and the first drive electrode 132b located on the reverse surface 103f side separated from each other by the electrode separation section 103r, which is located at roughly the center of the side surface 103j in the thickness direction (the Z-axis direction) of the drive vibrating arm 130, and is disposed along the extending direction (the Y-axis direction) of the drive vibrating arm 130. Further, the first drive electrode 132a is disposed on the inner side surface of the recessed section 158 opposed to the second drive electrode 131a, and the second drive electrode 131b is disposed on the inner side surface of the recessed section 158 opposed to the first drive electrode 132b. Further, on the side surface 103k located on the opposite side, there are disposed the first drive electrode 132a located on the obverse surface 103g side and the second drive electrode 131b located on the reverse surface 103f side separated from each other by the electrode separation section 103s, which is located at roughly the center of the side surface 103k in the thickness direction of the drive vibrating arm 130, and is disposed along the extending direction of the drive vibrating arm 130. Further, the second drive electrode 131a is disposed on the inner side surface of the recessed section 158 opposed to the first drive electrode 132a, and the first drive electrode 132b is disposed on the inner side surface of the recessed section 158 opposed to the second drive electrode 131b. It should be noted that the second drive electrode 132a and the first drive electrode 131a disposed on the inner side surfaces of the recessed section 158, and the first drive electrode 131b and the second drive electrode 132b disposed on the inner side surfaces of the recessed section 158 are separated by the respective bottom surfaces of the recessed sections 158.

Further, although not shown in the drawings, the second drive electrodes 131a and the second drive electrodes 131b are electrically connected to each other via the tip portion and so on of the drive vibrating arm 130. Similarly, although not shown in the drawings, the first drive electrodes 132a and the first drive electrodes 132b are electrically connected to each other via the tip portion and so on of the drive vibrating arm 130. It should be noted that the second drive electrodes 131a, 131b and the first drive electrodes 132a, 132b are disposed so as to extend to the vicinity of the tip of the drive vibrating arm 130. Further, the second drive electrodes 131a, 131b and the first drive electrodes 132a, 132b are electrically connected respectively to external connection pads not shown via wiring lines not shown.

In the drive vibrating arm 120, the first drive electrodes 121a and the first drive electrodes 121b are connected to each other so as to be equal in potential to each other, and the second drive electrodes 122a and the second drive electrodes 122b are connected to each other so as to be equal in potential to each other. Further, in the drive vibrating arm 130, the second drive electrodes 131a and the second drive electrodes 131b are connected to each other so as to be equal in potential to each other, and the first drive electrodes 132a and the first drive electrodes 132b are connected to each other so as to be equal in potential to each other. When applying alternating-current voltages different in phase from each other to the respective drive electrodes having such a configuration as described above, in the tuning fork vibrating element 100, the drive vibrating arm 120 and the drive vibrating arm 130 repeat flexural motions of being displaced in the respective directions opposite to each other along the Z-axis direction, and thus, the tuning fork vibrating element 100 makes the flexural vibration at a predetermined frequency.

The configurations of the first drive electrodes 121a, 121b, 132a, and 132b, and the second drive electrodes 122a, 122b, 131a, and 131b are not particularly limited, but are only required to have a conductive property, and to be able to be formed as a thin film. As a specific configuration, it is possible to form the drive electrodes using a metal material such as gold (Au), gold alloy, platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), or zirconium (Zr), and an electrically-conductive material such as indium tin oxide (ITO).

According to the tuning fork vibrating element 100 described above, the cross-sectional shapes of the drive vibrating arms 120, 130 each have a trapezoidal shape, and the side surfaces 103h, 103i, 103j, and 103k are exposed toward the obverse surfaces 103c, 103g. Further, since the electrode separation sections (separation lines) 103m, 103n, 103r, and 103s for separating the first drive electrodes 121a, 121b, 132a, and 132b and the second drive electrodes 122a, 122b, 131a, and 131b from each other are disposed on the tilted sections thus exposed, it is possible to directly irradiate the tilted sections, on which the electrode separation sections (separation lines) 103m, 103n, 103r, and 103s are disposed, with the irradiation light L for the exposure. Thus, it becomes possible to use the simple device, which uses the plane exposure, for forming the electrode separation sections 103m, 103n, 103r, and 103s using the exposure, and thus, it is possible to easily perform the exposure (the resist exposure) for forming the separation sections for separating the electrodes. Therefore, it is possible to perform the exposure (the resist exposure) for the electrode separation in the recessed sections (the grooves) 148, 158 and the side surfaces 103h, 103i, 103j, and 103k using the same simple device, which uses the plane exposure, and thus, it becomes possible to easily form the tuning fork vibrating element 100 at low cost.

It should be noted that in the tuning fork vibrating element 100, there can be adopted a configuration of being used as a gyro vibrating element (a gyro element) besides the configuration of being used as the vibrating element. In this case, one of the pair of drive vibrating arms 120, 130 is used as the drive vibrating arm, the other of the drive vibrating arms is used as a detection vibrating arm, and is provided with predetermined electrodes.

Second Embodiment

Vibrator Element-2

Then, a vibrator element according to a second embodiment will be explained with reference to FIGS. 2A and 2B.

Figure 2A:
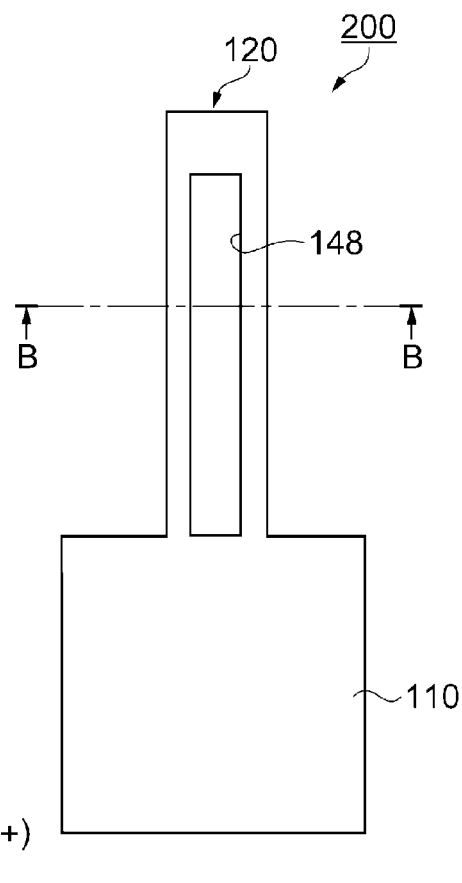
Figure 2B:
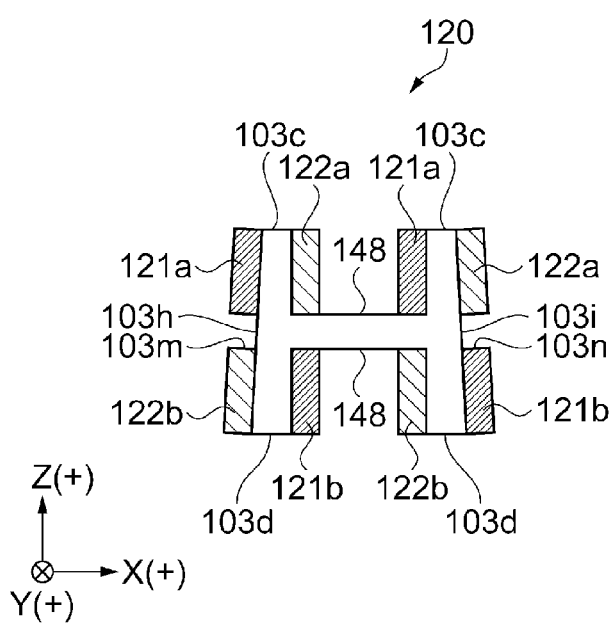

FIGS. 2A and 2B are diagrams schematically showing a general configuration of a flexural vibrating element as a vibrator element according to the second embodiment, wherein FIG. 2A is a plan view, and FIG. 2B is a cross-sectional view along the B-B line of FIG. 2A.

Firstly, a general configuration of the vibratory element according to the second embodiment will be explained. It should be noted that the flexural vibrating element 200 as the vibratory element according to the present second embodiment is provided with the drive vibrating arm 120 as the vibrating arm having the same configuration as that of the tuning fork vibrating element 100 described as the first embodiment. The same constituents as those of the tuning fork vibrating element 100 according to the first embodiment are denoted with the same reference numerals, and the duplicated explanations regarding the same constituents will be omitted.

As shown in FIGS. 2A and 2B, the flexural vibrating element 200 as the vibrator element is provided with the base section 110, and the drive vibrating arm 120 as the vibrating arm extending in the +Y-axis direction from the base section 110. The drive vibrating arm 120 has a prismatic shape having a trapezoidal cross-sectional shape, and is made to extend in the +Y-axis direction from a +Y side end of the base section 110 having a roughly rectangular plate-like shape. The base section 110 and the drive vibrating arm 120 constituting the flexural vibrating element 200 are formed integrally with each other, and the quartz crystal is used as the base material of the base section 110 and the drive vibrating arm 120. It should be noted that the flexural vibrating element 200 according to the second embodiment can be formed using a photolithography method and a dry etching method using a fluorinated gas or the like.

The basic configuration of the drive vibrating arm 120 is the same as that in the tuning fork vibrating element 100 described as the first embodiment, and therefore, the detailed explanation thereof will be omitted.

The drive vibrating arm 120 extending from the base section 110 is provided with an obverse surface 103c, a reverse surface 103d disposed on the opposite side to the obverse surface 103c, and side surfaces 103h, 103i connecting the obverse surface 103c and the reverse surface 103d to each other. Further, the drive vibrating arm. 120 is provided with recessed sections 148 each having a bottom, which are dug respectively from the obverse surface 103c and the reverse surface 103d, and extend along the Y-axis direction.

The side surfaces 103h, 103i of the drive vibrating arm 120 are configured as the tilted sections so that the side surfaces 103h, 103i turn toward the obverse surface 103c in a planar view of viewing the drive vibrating arm 120 from the obverse surface 103c side. As described above, the cross-sectional surface of the drive vibrating arm 120 has a trapezoidal shape as shown FIG. 2B. Further, the electrode separation sections (separation lines) 103m, 103n for separating the first drive electrodes 121a, 121b and the second drive electrodes 122a, 122b as the side surface electrodes described later from each other are disposed on the tilted sections of the side surfaces 103h, 103i.

Similarly to the first embodiment, by adopting such a configuration of the drive vibrating arm 120, in the exposure process in forming the electrode separation sections 103m, 103n and so on, if there is used the so-called plane exposure of irradiating the obverse surface 103c and the reverse surface 103d of the drive vibrating arm 120 with the light for the exposure, it is possible to easily irradiate the tilted sections in addition to the recessed sections (the grooves) 148 as the plane sections with the light. As described above, in the exposure of the tilted sections, it is possible to use the plane exposure of irradiating the tilted sections with the parallel light from the same direction. Therefore, it becomes possible to use the simple device, which uses the plane exposure, and it is possible to easily perform the exposure (resist exposure) for forming the electrode separation sections 103m, 103n for separating the first drive electrodes 121a, 121b and the second drive electrodes 122a, 122b from each other. Further, it is possible to perform the exposure (resist exposure) for forming the electrode separation sections (not shown) between the first drive electrodes 121a, 121b and the second drive electrodes 122a, 122b as the groove electrodes located inside the recessed sections (grooves) 148 on the bottom surfaces of the recessed sections (grooves) 148 using the simple device, which uses the plane exposure. As described above, the exposure (resist exposure) for the electrode separation on the side surfaces 103h, 103i and in the recessed sections (the grooves) 148 can easily be performed.

It should be noted that although not shown in the drawings, it is also possible for the tip portion of the drive vibrating arm 120 to be respectively provided with the weight section as the large-width section, which are larger in width (larger in the dimension in the X-axis direction) than the drive vibrating arm 120 and each have a roughly rectangular shape. In the configuration in which the drive vibrating arm 120 is provided with the weight section as the large-width section, since the predetermined drive vibration can be obtained while suppressing the increase in the length (the dimension in the Y-axis direction) of the drive vibrating arm 120, it becomes possible to miniaturize the flexural vibrating element 200.

Then, the drive electrodes of the flexural vibrating element 200 will be explained with reference to FIG. 2B. However, since the drive electrodes are substantially the same as in the configuration of the drive vibrating arm 120 explained in the above description of the first embodiment, the detailed explanation will be omitted. As the drive electrodes for driving the drive vibrating arm 120, there are provided the first drive electrodes 121a, 121b and the second drive electrodes 122a, 122b separated from each other by the electrode separation sections 103m, 103n.

In the drive vibrating arm 120, the first drive electrodes 121a and the first drive electrodes 121b are connected to each other so as to be equal in potential to each other, and the second drive electrodes 122a and the second drive electrodes 122b are connected to each other so as to be equal in potential to each other. When alternating voltages different in phase from each other are applied to the first drive electrodes 121a, 121b and the second drive electrodes 122a, 122b having such a configuration, the drive vibrating arm 120 repeats the flexural motion of being displaced along the Z-axis direction, and thus, the flexural vibrating element 200 can flexurally vibrate at a predetermined frequency.

According to the flexural vibrating element 200 described above, the cross-sectional shapes of the drive vibrating arm 120 has a trapezoidal shape, and the side surfaces 103h, 103i are exposed toward the obverse surface 103c. Further, the electrode separation sections (separation lines) 103m, 103n for separating the first drive electrodes 121a, 121b and the second drive electrodes 122a, 122b from each other are disposed on the tilted sections thus exposed. Thus, it becomes possible to use the simple device, which uses the plane exposure, for forming the electrode separation sections 103m, 103n using the exposure, and thus, it is possible to easily perform the exposure (the resist exposure) for forming the separation sections for separating the electrodes. Therefore, it is possible to perform the exposure (the resist exposure) for the electrode separation in the recessed sections (the grooves) 148 and the side surfaces 103h, 103i using the same simple device, which uses the plane exposure, and thus, it becomes possible to easily form the flexural vibrating element 200 at low cost.

Third Embodiment

Gyro Element-1

Figure 3A:
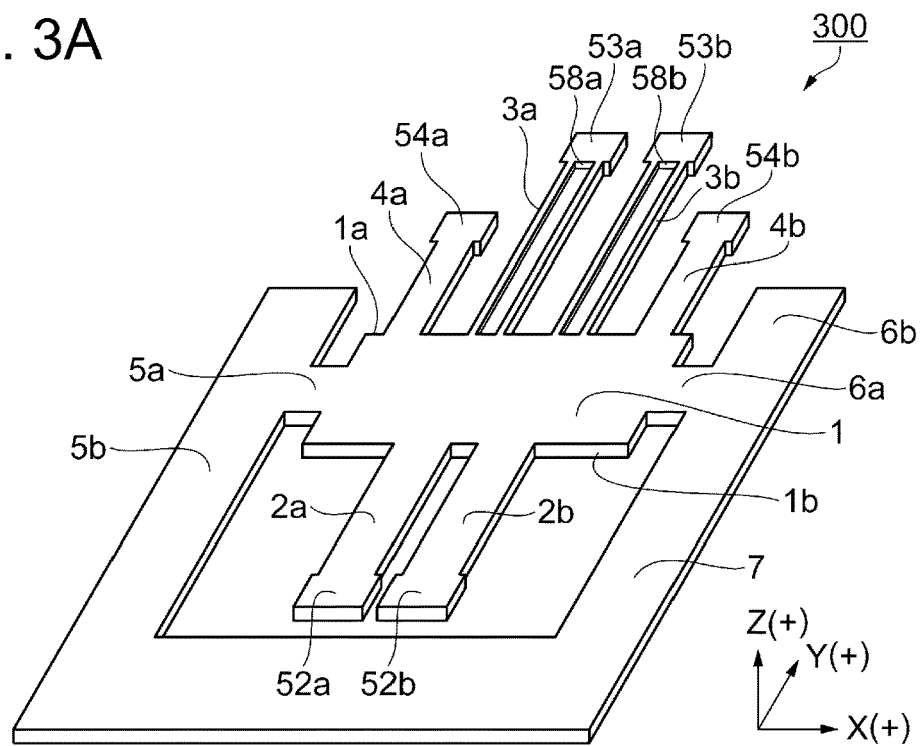
Figure 3B:
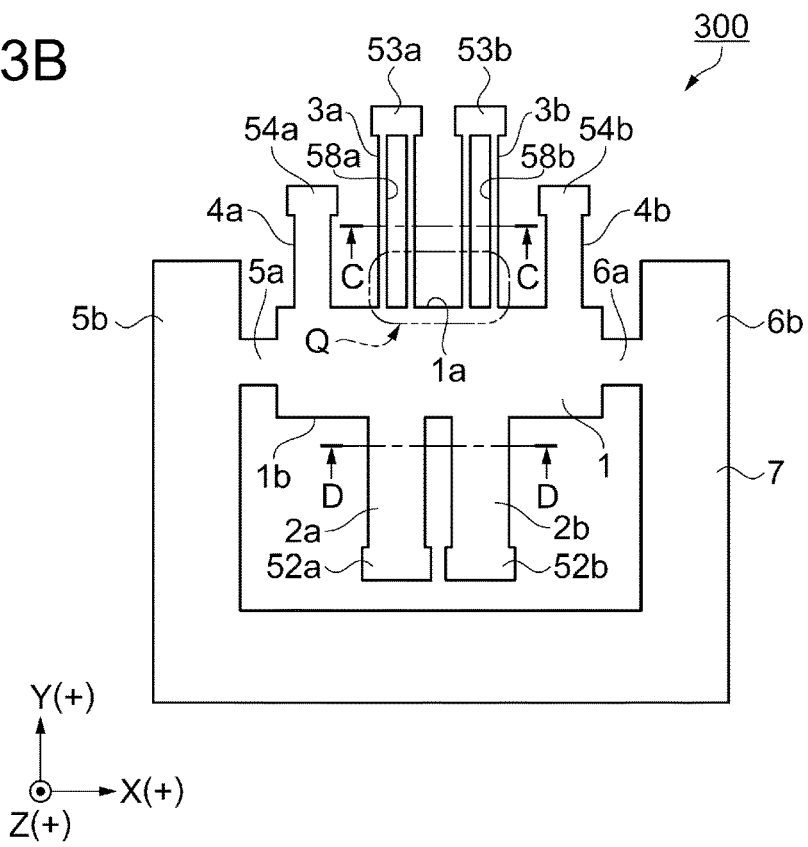
Figure 4:
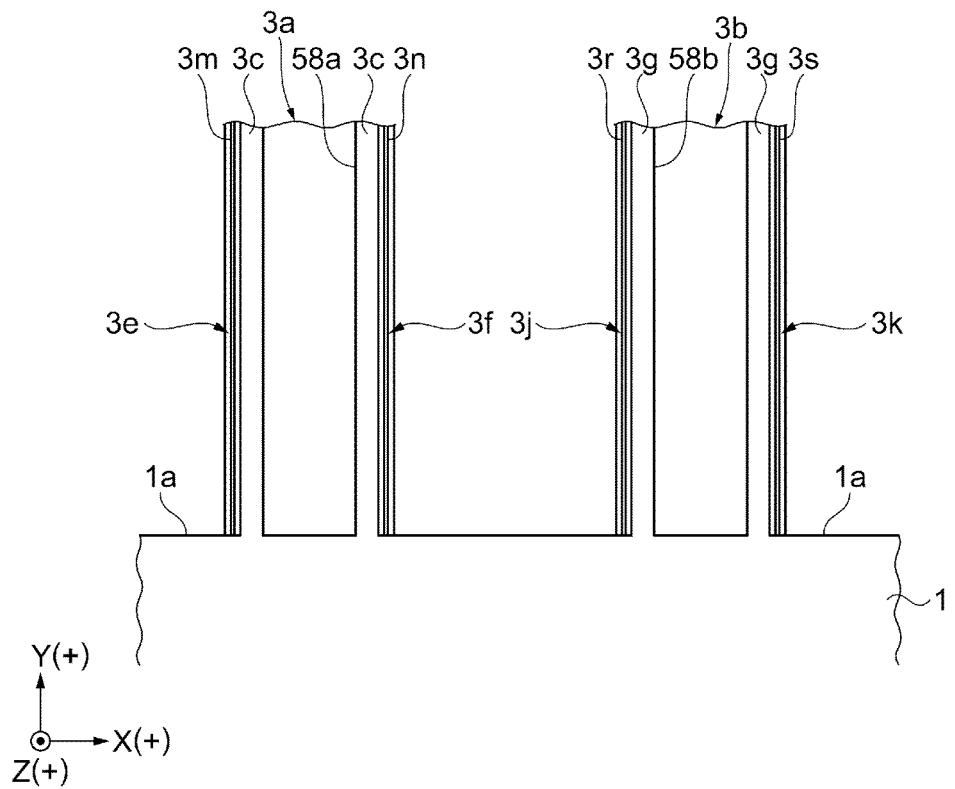
FIG. 4 is a partial plan view showing a detection vibrating arm of the gyro element according to the third embodiment in an enlarged manner.
Figure 5A:
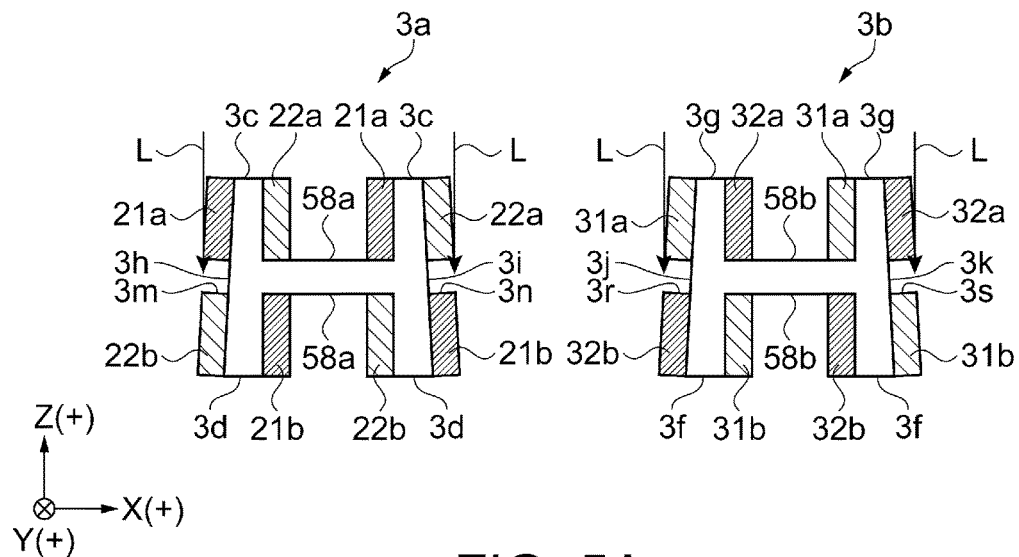
Figure 5B:
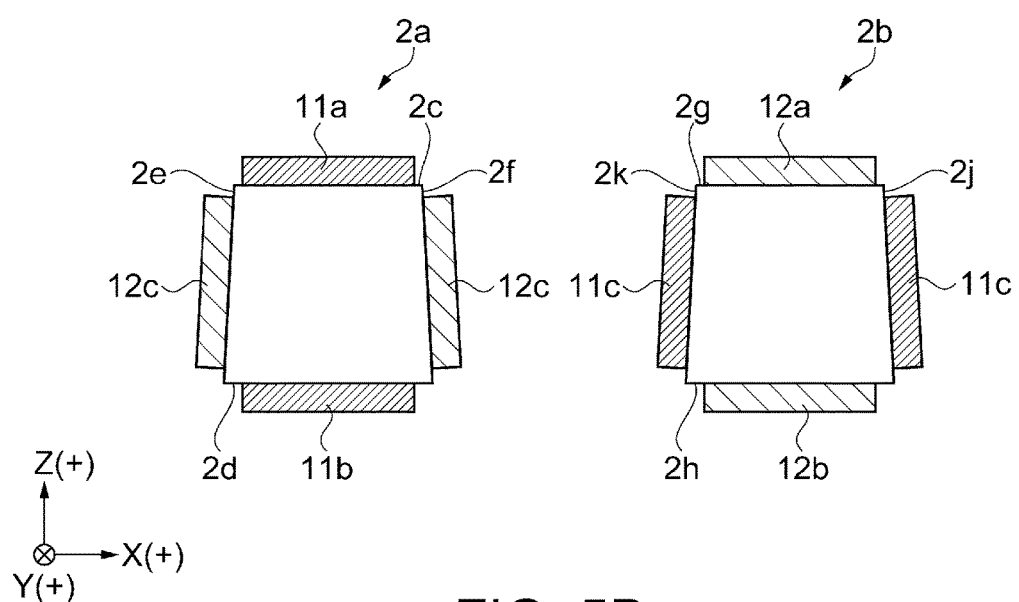

Firstly, a gyro element as a vibrator element according to a third embodiment of the invention will be explained with reference to FIGS. 3A, 3B, 4, 5A, and 5B. FIGS. 3A and 3B are diagrams showing the gyro element as the embodiment, wherein FIG. 3A is a perspective view schematically showing the gyro element, and FIG. 3B is a plan view schematically showing the gyro element. FIG. 4 is a diagram showing the detection vibrating arms of the gyro element in an enlarged manner, and is a partial plan view of the region Q shown in FIG. 3B. FIGS. 5A and 5B are diagrams for explaining an electrode configuration of the gyro element, wherein FIG. 5A is a cross-sectional view along the C-C line in FIG. 3B, and FIG. 5B is a cross-sectional view along the D-D line in FIG. 3B.

As shown in FIG. 3A, the gyro element 300 according to the third embodiment has a base section 1 integrally formed by processing a base material (a material constituting an essential part), drive vibrating arms 2a, 2b as the vibrating arms and detection vibrating arms 3a, 3b as the vibrating arms, and adjusting vibrating arms 4a, 4b. Further, there are disposed a first coupling section 5a extending from the base section 1, a first support section 5b coupled to the first coupling section 5a, a second coupling section 6a extending from the base section 1 in an opposite direction to the first coupling section 5a, and a second support section 6b coupled to the second coupling section 6a. Further, the first support section 5b and the second support section 6b are integrally connected to each other on the drive vibrating arms 2a, 2b side to constitute a fixation frame section 7.

Further, the gyro element 300 is fixed to a substrate of a package not shown or the like at a predetermined position of the fixation frame section 7.

An example of the gyro element 300 according to the present embodiment using quartz crystal, which is a piezoelectric material, as the base material will be explained. The quartz crystal has an X axis called an electrical axis, a Y axis called a mechanical axis, and a Z axis called an optical axis. In the present embodiment, there is explained an example of using a so-called quartz crystal Z plate as a base material. The quartz crystal Z plate is carved out along a plane defined by the X axis and the Y axis perpendicular to each other in the crystal axes of the quartz crystal, then processed to have a plate-like shape, and has a predetermined thickness t in the Z-axis direction perpendicular to the plane. It should be noted that the predetermined thickness t mentioned here is appropriately set in accordance with the oscillation frequency (resonant frequency), the outside dimensions, the workability, and so on. Further, the plate forming the gyro element 300 can accept the error in the angle, at which the plate is caved out from the quartz crystal, in some range with respect to each of the X axis, Y axis, and Z axis. For example, it is possible to use the plate carved out after being rotated in a range of 0 through 2 degrees around the X axis. The same applies to the Y axis and the Z axis.

The gyro element 300 has the base section 1 having a roughly rectangular shape and located in the central part, the pair of drive vibrating arms 2a, 2b extending in parallel to each other along the Y axis from one (the end portion in the −Y direction in the drawing) 1b of the end portions 1a, 1b in the Y-axis direction of the base section 1, and the pair of detection vibrating arms 3a, 3b extending in parallel to each other along the Y axis from the other (the end portion in the +Y direction) 1a of the end portions of the base section 1. As described above, the pair of drive vibrating arms 2a, 2b and the pair of detection vibrating arms 3a, 3b respectively extend from the both end portions 1a, 1b of the base section 1 in the same axis directions. Due to such a shape as described above, the gyro element 300 according to the present embodiment is called an H-type gyro element in some cases. In the H-type gyro element 300, since the drive vibrating arms 2a, 2b and the detection vibrating arms 3a, 3b respectively extend from the both end portions in the same axis directions of the base section 1, the drive system and the detection system are separated from each other. Since the drive system and the detection system are separated from each other in such as manner as described above, the gyro element 300 has a feature that the capacitive coupling between the electrodes or the wiring lines of the drive system and the detection system is reduced, and thus, the detection sensitivity is stabilized. It should be noted that although the pair of drive vibrating arms and the pair of detection vibrating arms are provided in the third embodiment taking the H-type vibrating element as the example, the number of vibrating arms can also be one or more than three. Further, it is also possible to provide the drive electrode and the detection electrode described later to one vibrating arm.

When the angular velocity ω is applied around the Y axis to the H-type gyro element 300 in the case in which the pair of drive vibrating arms 2a, 2b are vibrating in the in-plane direction (the +X-axis direction and the −X-axis direction), the Coriolis force occurs in the drive vibrating arms 2a, 2b, and the drive vibrating arms 2a, 2b flexurally vibrate in the respective directions opposite to each other in the out-of-plane direction (the +Z-axis direction and the −Z-axis direction) intersecting with the in-plane direction. Then, the detection vibrating arms 3a, 3b resonate with the flexural vibration in the out-of-plane direction of the drive vibrating arms 2a, 2b, and thus flexurally vibrate in the out-of-plane direction in the same manner. On this occasion, electric charge occurs in the detection electrodes provided to the detection vibrating arms 3a, 3b due to the piezoelectric effect. It is possible for the gyro element 300 to detect the angular velocity ω applied to the gyro element 300 by detecting the electric charge.

As shown in FIGS. 5A and 5B, the pair of drive vibrating arms 2a, 2b as the vibrating arms extending from the base section 1 are provided with obverse surfaces 2c, 2g, reverse surfaces 2d, 2h disposed on the opposite side to the obverse surfaces 2c, 2g, and side surfaces 2e, 2f, 2k, and 2j for connecting the obverse surfaces 2c, 2g and the reverse surfaces 2d, 2h to each other. The side surfaces 2e, 2f, 2k, and 2j are configured as tilted sections so that the side surfaces 2e, 2f, 2k, and 2j turn toward the obverse surfaces 2c, 2g in a planar view of viewing the drive vibrating arms 2a, 2b from the obverse surfaces 2c, 2g side. In other words, the side surfaces 2e, 2f, 2k, and 2j are arranged to be surfaces exposed toward the obverse surfaces 2c, 2g so as to be visually recognized when viewed from the obverse surface 2c, 2g side. Further, the tip portions of the drive vibrating arms 2a, 2b are respectively provided with weight sections 52a, 52b as large-width sections, which are larger in width (larger in the dimension in the X-axis direction) than the drive vibrating arms 2a, 2b, respectively, and each have a roughly rectangular shape (see FIGS. 3A and 3B). It should be noted that the tip portions of the drive vibrating arms 2a, 2b denote portions of the open ends of the drive vibrating arms 2a, 2b on the other end side of the drive vibrating arms 2a, 2b opposite to one end of the drive vibrating arms 2a, 2b, respectively. As described above, since the drive vibrating arms 2a, 2b are provided with the weight sections 52a, 52b, and therefore, the predetermined drive vibration can be obtained while suppressing the increase in the length (the dimension in the Y-axis direction) of the drive vibrating arms 2a, 2b, it becomes possible to miniaturize the gyro element. It should be noted that although the drive vibrating arms 2a, 2b are provided with electrodes for driving the drive vibrating arms 2a, 2b, the configuration of the electrodes will be described later.

The detection vibrating arms 3a, 3b as the pair of vibrating arms extending from the base section 1 are provided with obverse surfaces 3c, 3g, reverse surfaces 3d, 3f disposed on the opposite side to the obverse surfaces 3c, 3g, and side surfaces 3h, 3i, 3j, and 3k for connecting the obverse surfaces 3c, 3g and the reverse surfaces 3d, 3f to each other. In the explanation with reference to FIGS. 4, 5A, and 5B, the side surfaces 3h, 3i, 3j, and 3k are configured as tilted sections so that the side surfaces 3h, 3i, 3j, and 3k turn toward the obverse surfaces 3c, 3g in a planar view of viewing the detection vibrating arms 3a, 3b from the obverse surfaces 3c, 3g side. In other words, the side surfaces 3h, 3i, 3j, and 3k are arranged to be surfaces exposed toward the obverse surfaces 3c, 3g so as to be visually recognized when viewed from the obverse surface 3c, 3g side. In each of the detection vibrating arms 3a, 3b in the present embodiment, there is adopted a configuration of having a trapezoidal cross-sectional shape as shown in FIG. 5A. Further, the tilted sections are provided with the electrode separation sections (the separation lines) 3m, 3n, 3r, and 3s (see FIG. 4) for separating the first detection electrodes 21a, 21b, 32a, and 32b and the second detection electrodes 22a, 22b, 31a, and 31b of the detection electrodes described later from each other.

Although the details will be explained in the latter part, by adopting such a configuration of the detection vibrating arms 3a, 3b, in the exposure process in forming the electrode separation sections 3m, 3n, 3r, and 3s, if there is used the so-called plane exposure of irradiating the obverse surfaces 3c, 3g and the reverse surfaces 3d, 3f of the detection vibrating arms 3a, 3b with the light for the exposure, it is possible to easily irradiate the tilted sections with the light. In other words, it is possible to directly irradiate the tilted sections corresponding to the electrode separation sections (the separation lines) 3m, 3n, 3r, and 3s with the irradiation light L for the exposure. As described above, in the exposure of the tilted sections, it is possible to use the plane exposure of irradiating the tilted sections with the parallel light from the same direction. Therefore, it becomes possible to use the simple device, which uses the plane exposure, and it is possible to easily perform the exposure (resist exposure) for forming the electrode separation sections 3m, 3n, 3r, and 3s for separating the first detection electrodes 21a, 21b, 32a, and 32b and the second detection electrodes 22a, 22b, 31a, 31b from each other.

Going back to FIGS. 3A and 3B, in the explanation with reference to FIGS. 3A and 3B, the tip portions of the detection vibrating arms 3a, 3b are respectively provided with weight sections 53a, 53b as large-width sections, which are larger in width (larger in the dimension in the X-axis direction) than the detection vibrating arms 3a, 3b, respectively, and each have a roughly rectangular shape. As described above, since the detection vibrating arms 3a, 3b are also provided with the weight sections 53a, 53b, and therefore, the predetermined detection vibration can be obtained while suppressing the increase in the length (the dimension in the Y-axis direction) of the detection vibrating arms 3a, 3b, it becomes possible to miniaturize the gyro element.

Further, the pair of detection vibrating arms 3a, 3b are respectively provided with recessed sections (grooves) 58a, 58b. Although the recessed sections (the grooves) 58a, 58b in the present embodiment have configurations of being dug from the both surface sides, namely the obverse surface 3c, 3g side and the reverse surface 3d, 3f side as shown in FIG. 5A, it is also possible to adopt configurations of being dug from one of the obverse surfaces 3c, 3g and the reverse surfaces 3d, 3f.

Further, as shown in FIGS. 3A and 3B, the gyro element 300 is provided with the pair of adjusting vibrating arms 4a, 4b extending from the base section 1 in a direction intersecting with the crystal X axis (the electrical axis) of the quartz crystal in parallel to the detection vibrating arms 3a, 3b so as to have the detection vibrating arms 3a, 3b located inside the adjusting vibrating arms 4a, 4b. In other words, the adjusting vibrating arms 4a, 4b extend in the +Y direction along the Y axis, and are located so as to sandwich the detection vibrating arms 3a, 3b inside with predetermined distances, and in parallel to the detection vibrating arms 3a, 3b. It should be noted that the adjusting vibrating arms 4a, 4b are also referred to as tuning arms in some cases. Since such adjusting vibrating arms 4a, 4b are disposed, it becomes possible to control leakage output. In other words, it becomes possible to cancel out the charge caused by so-called vibration leakage in which the drive vibration is leaked (propagated) using charge adjustment by the adjusting vibrating arms 4a, 4b to thereby suppress the output of the vibration leakage. Thus, it becomes possible to stabilize the characteristics of the gyro element 300.

Further, the adjusting vibrating arms 4a, 4b are formed to have a length smaller than the lengths of the drive vibrating arms 2a, 2b and the detection vibrating arms 3a, 3b. Thus, since the vibration of the adjusting vibrating arms 4a, 4b for adjusting the leakage output does not hinder the primary vibration of the gyro element 300 by the drive vibrating arms 2a, 2b and the detection vibrating arms 3a, 3b, the vibration characteristics of the gyro element 300 are stabilized, and at the same time, an advantageous effect to the miniaturization of the gyro element 300 can be obtained.

Further, the tip portions of the adjusting vibrating arms 4a, 4b are provided with weight sections 54a, 54b as the large-width portions having a roughly rectangular shape larger in width (greater in length in the X-axis direction) than the adjusting vibrating arms 4a, 4b, respectively. By providing the weight sections 54a, 54b to the tip portions of the adjusting vibrating arms 4a, 4b as described above, it is possible to make the mass change in the adjusting vibrating arms 4a, 4b remarkable, and it is possible to further enhance the effect of making a contribution to an improvement in sensitivity of the gyro element 300.

The center of the base section 1 can be the center of gravity of the gyro element 300. Further, it is assumed that the X axis, the Y axis, and the Z axis are perpendicular to each other, and pass through the center of gravity. The outer shape of the gyro element 300 can be axisymmetric about an imaginary center line in the Y-axis direction passing through the center of gravity. Thus, the gyro element 300 has a well-balanced outer shape, and the characteristics of the gyro element 300 are stabilized to thereby preferably enhance the detection sensitivity. Such an outer shape of the gyro element 300 can be formed by etching (wet etching or dry etching) using a photolithography technology. It should be noted that a plurality of such gyro elements 300 can be obtained from a single quartz crystal wafer.

Then, an example of an electrode arrangement of the gyro element 300 will be explained with reference to FIGS. 5A and 5B. FIG. 5A shows a cross-sectional surface of the detection vibrating arms 3a, 3b in the C-C section shown in FIG. 3B, and FIG. 5B shows a cross-sectional surface of the drive vibrating arms 2a, 2b in the D-D section shown in FIG. 3B.

Firstly, there will be explained the detection electrodes provided to the detection vibrating arms 3a, 3b, and for detecting the distortion generated in the quartz crystal as the base material due to the vibration of the detection vibrating arms 3a, 3b. As shown in FIG. 5A, the pair of detection vibrating arms 3a, 3b are respectively provided with the recessed sections 58a, 58b as described above. The recessed sections 58a, 58b in the present embodiment are respectively disposed on the both surface sides, namely on the obverse surfaces 3c, 3g, and the reverse surfaces 3d, 3f. Further, as described above, the side surfaces 3h, 3i, 3j, and 3k are each formed as the tilted section tilted so as to be exposed toward the obverse surfaces 3c, 3g.

In the detection vibrating arm 3a, on the side surface 3h, there are disposed the first detection electrode 21a located on the obverse surface 3c side and the second detection electrode 22b located on the reverse surface 3d side separated from each other by the electrode separation section 3m, which is located at roughly the center of the side surface 3h in the thickness direction (the Z-axis direction) of the detection vibrating arm 3a, and is disposed along the extending direction (the Y-axis direction) of the detection vibrating arm 3a. Further, the second detection electrode 22a as the groove electrode is disposed on the inner side surface of the recessed section (the groove) 58a opposed to the first detection electrode 21a, and the first detection electrode 21b as the groove electrode is disposed on the inner side surface of the recessed section 58a opposed to the second detection electrode 22b. Further, on the side surface 3i located on the opposite side, there are disposed the second detection electrode 22a located on the obverse surface 3c side and the first detection electrode 21b located on the reverse surface 3d side as the side surface electrodes separated from each other by the electrode separation section 3n, which is located at roughly the center of the side surface 3i in the thickness direction of the detection vibrating arm 3a, and is disposed along the extending direction of the detection vibrating arm 3a. Further, the first detection electrode 21a as the groove electrode is disposed on the inner side surface of the recessed section 58a opposed to the second detection electrode 22a, and the second detection electrode 22b as the groove electrode is disposed on the inner side surface of the recessed section 58a opposed to the first detection electrode 21b. It should be noted that the second detection electrode 22a and the first detection electrode 21a disposed on the inner side surfaces of the recessed section 58a, and the first detection electrode 21b and the second detection electrode 22b disposed on the inner side surfaces of the recessed section 58a are separated by the respective bottom surfaces of the recessed sections 58a.

Further, although not shown in the drawings, the first detection electrodes 21a and the first detection electrodes 21b are electrically connected to each other via the tip portion and so on of the detection vibrating arm 3a. Although not shown in the drawings, the second detection electrodes 22a and the second detection electrodes 22b are electrically connected to each other via the tip portion and so on of the detection vibrating arm 3a. It should be noted that the first detection electrodes 21a, 21b and the second detection electrodes 22a, 22b are disposed so as to extend to the vicinity of the tip of the detection vibrating arm 3a. Further, the first detection electrodes 21a, 21b and the second detection electrodes 22a, 22b are electrically connected respectively to external connection pads not shown via wiring lines not shown. Further, the first detection electrodes 21a, 21b and the second detection electrodes 22a, 22b are also electrically connected respectively to adjusting electrodes not shown provided to the adjusting vibrating arm 4a (see FIGS. 3A and 3B).

Similarly, in the detection vibrating arm 3b, on the side surface 3j, there are disposed the second detection electrode 31a located on the obverse surface 3g side and the first detection electrode 32b located on the reverse surface 3f side separated from each other by the electrode separation section 3r, which is located at roughly the center of the side surface 3j in the thickness direction (the Z-axis direction) of the detection vibrating arm 3b, and is disposed along the extending direction (the Y-axis direction) of the detection vibrating arm 3b. Further, the first detection electrode 32a is disposed on the inner side surface of the recessed section (the groove) 58b opposed to the second detection electrode 31a, and the second detection electrode 31b is disposed on the inner side surface of the recessed section 58b opposed to the first detection electrode 32b. Further, on the side surface 3k located on the opposite side to the side surface 3j, there are disposed the first detection electrode 32a located on the obverse surface 3g side and the second detection electrode 31b located on the reverse surface 3f side separated from each other by the electrode separation section 3s, which is located at roughly the center of the side surface 3k in the thickness direction of the detection vibrating arm 3b, and is disposed along the extending direction of the detection vibrating arm 3b. Further, the second detection electrode 31a is disposed on the inner side surface of the recessed section 58b opposed to the first detection electrode 32a, and the first detection electrode 32b is disposed on the inner side surface of the recessed section 58b opposed to the second detection electrode 31b. It should be noted that the first detection electrode 32a and the second detection electrode 31a disposed on the inner side surfaces of the recessed section 58b, and the second detection electrode 31b and the first detection electrode 32b disposed on the inner side surfaces of the recessed section 58b are separated by the respective bottom surfaces of the recessed sections 58b.

Further, although not shown in the drawings, the second detection electrodes 31a and the second detection electrodes 31b are electrically connected to each other via the tip portion and so on of the detection vibrating arm 3b. Although not shown in the drawings, the first detection electrodes 32a and the first detection electrodes 32b are electrically connected to each other via the tip portion and so on of the detection vibrating arm 3b. It should be noted that the second detection electrodes 31a, 31b and the first detection electrodes 32a, 32b are disposed so as to extend to the vicinity of the tip of the detection vibrating arm 3b. Further, the second detection electrodes 31a, 31b and the first detection electrodes 32a, 32b are electrically connected respectively to external connection pads not shown via wiring lines not shown. Further, the second detection electrodes 31a, 31b and the first detection electrodes 32a, 32b are also electrically connected respectively to adjusting electrodes not shown provided to the adjusting vibrating arm 4b (see FIGS. 3A and 3B).

In the detection vibrating arm 3a, the first detection electrodes 21a and the first detection electrodes 21b are connected to each other so as to be equal in potential to each other, and the second detection electrodes 22a and the second detection electrodes 22b are connected to each other so as to be equal in potential to each other. Thus, the distortion caused by the vibration of the detection vibrating arm 3a is detected by detecting the electrical potential difference between the first detection electrodes 21a, 21b and the second detection electrodes 22a, 22b. Similarly, in the detection vibrating arm 3b, the first detection electrodes 32a and the first detection electrodes 32b are connected to each other so as to be equal in potential to each other, and the second detection electrodes 31a and the second detection electrodes 31b are connected to each other so as to be equal in potential to each other. Thus, the distortion caused by the vibration of the detection vibrating arm 3b is detected by detecting the electrical potential difference between the first detection electrodes 32a, 32b and the second detection electrodes 31a, 31b.

Then, the drive electrodes 11a, 11b, 11c, 12a, 12b, and 12c provided to the drive vibrating arms 2a, 2b and for driving the drive vibrating arms 2a, 2b will be explained. As shown in FIG. 5B, the drive electrode 11a is formed on an obverse surface (one of the principal surfaces) 2c of the drive vibrating arm 2a, and the drive electrode 11b is formed on a reverse surface (the other of the principal surfaces) 2d thereof, in the areas extending to the weight section 52a (see FIGS. 3A and 3B). Further, on one side surface 2e of the drive vibrating arm 2a and the other side surface 2f thereof, there are formed drive electrodes 12c in the areas extending to the weight section 52a (see FIGS. 3A and 3B) of the drive vibrating arm 2a. Similarly, the drive electrode 12a is formed on an obverse surface (one of the principal surfaces) 2g of the drive vibrating arm 2b, and the drive electrode 12b is formed on a reverse surface (the other of the principal surfaces) 2h thereof, in the areas extending to the weight section 52b (see FIGS. 3A and 3B). Further, on one side surface 2j of the drive vibrating arm 2b and the other side surface 2k thereof, there are formed drive electrodes 11c in the areas extending to the weight section 52b (see FIGS. 3A and 3B) of the drive vibrating arm 2b.

The drive electrodes 11a, 11b, 11c, 12a, 12b, and 12c provided to the drive vibrating arms 2a, 2b are arranged so that the drive electrodes disposed to be opposed to each other via the drive vibrating arms 2a, 2b have the same electrical potential. Further, although not shown in the drawings, by alternately applying the electrical potential difference between the drive electrodes 11a, 11b, and 11c and the drive electrodes 12a, 12b, and 12c via the connection pads provided to the first fixation section, to which the drive electrodes 11a, 11b, and 11c are connected, and the connection pads provided to the second fixation section, to which the drive electrodes 12a, 12b, and 12c are connected, a so-called tuning fork vibration is excited in the drive vibrating arms 2a, 2b.

Then, the electrodes provided to the adjusting vibrating arms 4a, 4b will be explained. Although not shown in the drawings, the adjusting vibrating arm 4a is provided with the adjusting electrodes having the equal electrical potential formed on the obverse and reverse surfaces. Further, on the both side surfaces of the adjusting vibrating arm 4a, there are respectively formed other adjusting electrodes having the equal electrical potential. Similarly, the adjusting vibrating arm 4b is provided with the adjusting electrodes having the equal electrical potential formed on the obverse and reverse surfaces. Further, on the both side surfaces of the adjusting vibrating arm 4b, there are respectively formed other adjusting electrodes having the equal electrical potential. It should be noted that either one of the adjusting electrodes on the obverse and reverse surfaces and the adjusting electrodes on the both side surfaces are electrically connected to the detection electrodes.

It should be noted that the configurations of the drive electrodes 11a, 11b, 11c, 12a, 12b, and 12c, the first detection electrodes 21a, 21b, 32a, and 32b, the second detection electrodes 22a, 22b, 31a, and 31b, and the adjusting electrodes described above are substantially the same as the electrode configuration explained in the description of the first embodiment, and therefore, the explanation in the present embodiment will be omitted.

As described above, according to the gyro element 300 related to the present embodiment, when the angular velocity ω around the Y axis is applied to the gyro element 300 in the state in which the drive vibrating arms 2a, 2b are vibrating due to a predetermined excitation drive signal applied thereto, the Coriolis force occurs in the drive vibrating arms 2a, 2b, and the drive vibrating arms 2a, 2b flexurally vibrate in the respective directions opposite to each other in the out-of-plane direction (the +Z-axis direction and the −Z-axis direction) intersecting with the in-plane direction. Further, the adjusting vibrating arms 4a, 4b are excited by the vibration of the drive vibrating arms 2a, 2b. Therefore, by increasing or decreasing the weight of the adjusting electrodes as metal films provided to the adjusting vibrating arms 4a, 4b, or changing the charge amount by increasing or decreasing the volume of the adjusting electrodes, the unwanted leakage output of the detection vibrating arms 3a, 3b can be suppressed.

Further, according to the gyro element 300 described above, the cross-sectional shapes of the pair of detection vibrating arms 3a, 3b each have a trapezoidal shape, and the side surfaces 3h, 3i, 3j, and 3k are exposed toward the obverse surfaces 3c, 3g. Further, it is possible to directly irradiate the tilted sections provided with the electrode separation sections (the separation lines) 3*m*, 3*n*, 3*r*, and 3*s* for separating the first detection electrodes 21*a*, 21*b*, 32*a*, and 32*b* and the second detection electrodes 22*a*, 22*b*, 31*a*, and 31*b* from each other with the irradiation light L for the exposure. Thus, it becomes possible to use the simple device using the plane exposure for forming the electrode separation sections 3*m*, 3*n*, 3*r*, and 3*s* using the exposure in the side surfaces 3*h*, 3*i*, 3*j*, and 3*k*. Further, at the same time, it is possible to perform the exposure (resist exposure) for forming the electrode separation sections (not shown) between the first detection electrodes 21*a*, 21*b*, 32*a*, and 32*b* and the second detection electrodes 22*a*, 22*b*, 31*a*, 31*b* located inside the recessed sections (grooves) 58*a*, 58*b* on the bottom surfaces of the recessed sections (grooves) 58*a*, 58*b*. As described above, the exposure (resist exposure) for the electrode separation on the side surfaces 3*h*, 3*i*, 3*j*, and 3*k*, and in the recessed sections (the grooves) 58*a*, 58*b* can easily be performed. In other words, it becomes possible to easily form the gyro element 300 having the electrode separation sections 3*m*, 3*n*, 3*r*, and 3*s* at low cost.

It should be noted that although in the explanation of the gyro element 300 according to the third embodiment described above, there is used the example in which the pair of detection vibrating arms 3*a*, 3*b*, and the pair of adjusting vibrating arms 4*a*, 4*b* having the detection vibrating arms 3*a*, 3*b* therebetween are disposed on one end of the base section 1, and the pair of drive vibrating arms 2*a*, 2*b* are disposed on the other end thereof, the invention is not limited to this configuration. For example, there can also be adopted the configuration in which the drive vibrating arms and the adjusting vibrating arms extend from the same end of the base section in the same direction.

Fourth Embodiment

Gyro Element-2

Then, a gyro element 400 according to a fourth embodiment will be explained with reference to FIGS. 6A and 6B.

Figure 6A:
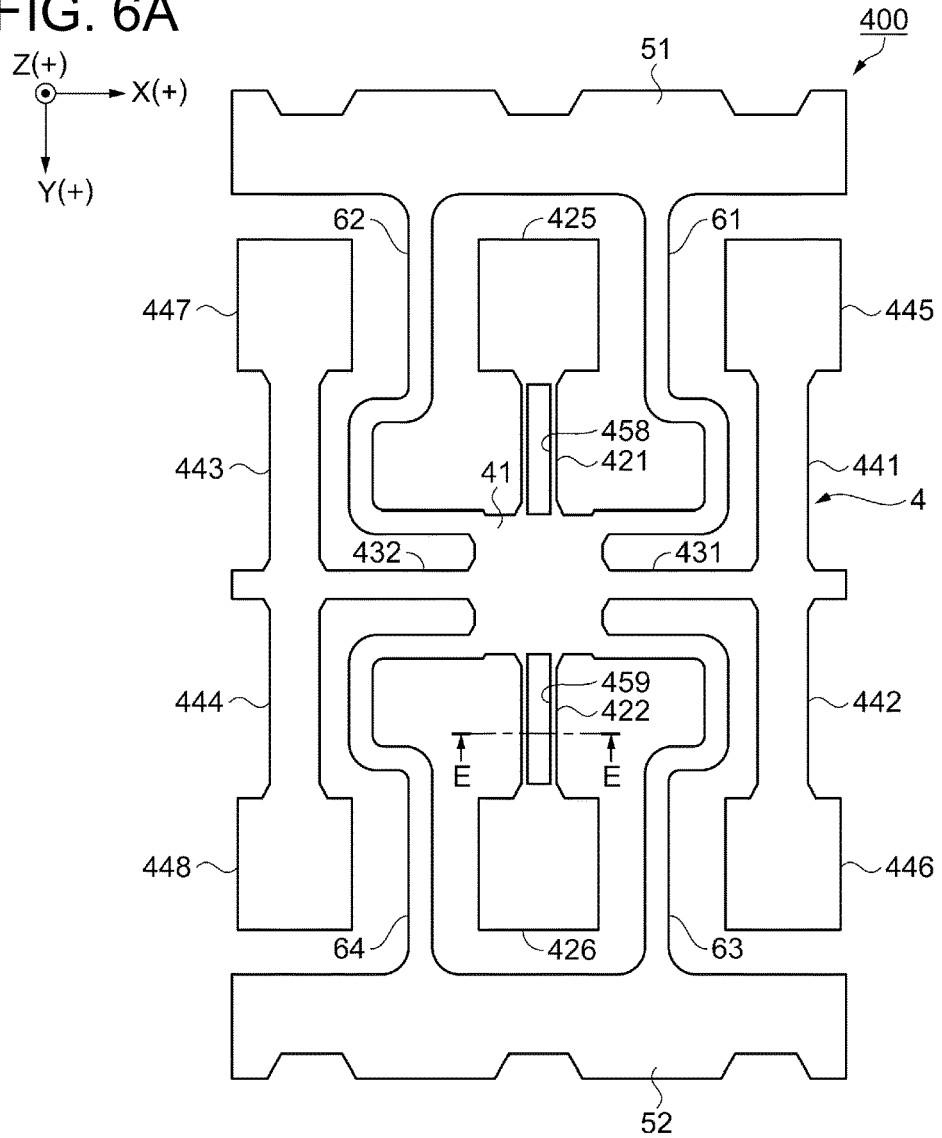
Figure 6B:
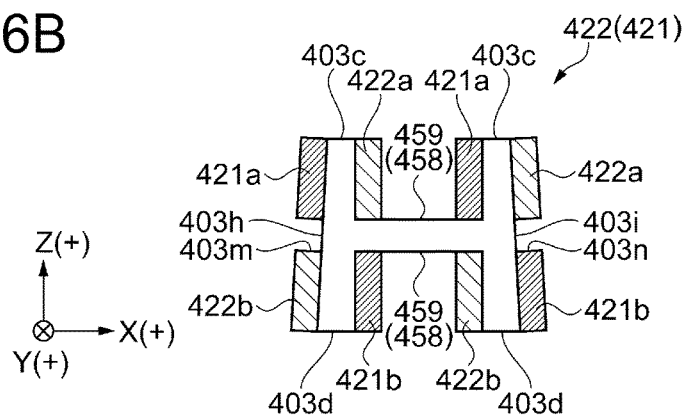

FIGS. 6A and 6B schematically show a general configuration of the gyro element according to the fourth embodiment, wherein FIG. 6A is a plan view of the gyro element viewed from the Z-axis direction on the positive side, and FIG. 6B is a cross-sectional view along the E-E line of FIG. 6A. It should be noted that a detection signal electrode, detection signal wiring, a detection signal terminal, a detection ground electrode, detection ground wiring, a detection ground terminal, a drive signal electrode, drive signal wiring, a drive signal terminal, a drive ground electrode, drive ground wiring, a drive ground terminal, and so on are provided to the gyro element 400, but are omitted from FIG. 6A.

The gyro element 400 according to the fourth embodiment is an "out-of-plane detection type" sensor element for detecting an angular velocity around the Z axis, and is composed of a base member, and a plurality of electrodes, wiring lines, and terminals disposed on the surface of the base member although not shown in the drawing. The gyro element 400 can be formed of a piezoelectric material such as quartz crystal, lithium tantalate, or lithium niobate, and is preferably formed of quartz crystal among these materials. According to the configuration described above, the gyro element 400 capable of exerting excellent vibration characteristics (frequency characteristics) can be obtained.

Such a gyro element 400 as described above has a vibrating body 4 forming a so-called double T shape, a first support section 51 and a second support section 52 as support sections for supporting the vibrating body 4, a first beam 61, a second beam 62, a third beam 63, and a fourth beam 64 for connecting the vibrating body 4, and the first support section 51 and the second support section 52 to each other.

The vibrating body 4 has a spread in the X-Y plane, and has a thickness in the Z-axis direction. Such a vibrating body 4 as described above has the base section 41 located at the center, the first detection vibrating arm 421 and the second detection vibrating arm 422 as the vibrating arms extending from the base section 41 on both sides along the Y-axis direction, the first connection arm 431 and the second connection arm 432 extending from the base section 41 on both sides along the X-axis direction, the first drive vibrating arm 441 and the second drive vibrating arm 442 as the vibrating arms extending from the tip portion of the first connection arm 431 on both sides along the Y-axis direction, and the third drive vibrating arm 443 and the fourth drive vibrating arm 444 as the vibrating arms extending from the tip portion of the second connection arm 432 on both sides along the Y-axis direction. At the tip portions of the first and second detection vibrating arms 421, 422, and the first through fourth drive vibrating arms 441, 442, 443, and 444, there are respectively disposed the weight sections (hammerheads) 425, 426, 445, 446, 447, and 448 each having a quadrangular shape larger in width than the base end side. By disposing such weight sections 425, 426, 445, 446, 447, and 448 as described above, the detection sensitivity of the angular velocity of the gyro element 400 is improved.

The first detection vibrating arm 421 is provided with recessed sections (grooves) 458 each having a bottom, and the second detection vibrating arm 422 is provided with recessed sections (grooves) 459 each having a bottom. Since the first detection vibrating arm 421 and the second detection vibrating arm 422 have substantially the same configurations, the second detection vibrating arm 422 will hereinafter be shown as an example to be explained with reference to FIG. 6B, and the explanation of the configuration of the first detection vibrating arm 421 will be omitted.

The recessed sections 459 of the second detection vibrating arm 422 are dug from the both surface sides, namely the obverse surface 403*c* and the reverse surface 403*d*, respectively. It should be noted that the recessed section can also have a configuration of being dug from either one of the surfaces, namely the obverse surface 403*c* and the reverse surface 403*d*. Further, as described above, the side surfaces 403*h*, 403*i* are each formed as the tilted section tilted so as to be exposed toward the obverse surface 403*c*.

Further, in the second detection vibrating arm. 422, on the side surface 403*h*, there are disposed the first detection electrode 421*a* located on the obverse surface 403*c* side and the second detection electrode 422*b* located on the reverse surface 403*d* side as the side surface electrodes separated from each other by the electrode separation section 403*m*, which is located at roughly the center of the side surface 403*h* in the thickness direction (the Z-axis direction) of the second detection vibrating arm 422, and is disposed along the extending direction (the Y-axis direction) of the second detection vibrating arm 422. Further, the second detection electrode 422*a* as the groove electrode is disposed on the inner side surface of the recessed section 459 opposed to the first detection electrode 421*a*, and the first detection electrode 421*b* as the groove electrode is disposed on the inner side surface of the recessed section 459 opposed to the second detection electrode 422*b*. Further, on the side surface 403*i* located on the opposite side, there are disposed the second detection electrode 422*a* located on the obverse surface 403c side and the first detection electrode 421b located on the reverse surface 403d side as the side surface electrodes separated from each other by the electrode separation section 403n, which is located at roughly the center of the side surface 403i in the thickness direction of the second detection vibrating arm 422, and is disposed along the extending direction of the second detection vibrating arm 422. Further, the first detection electrode 421a as the groove electrode is disposed on the inner side surface of the recessed section 459 opposed to the second detection electrode 422a, and the second detection electrode 422b as the groove electrode is disposed on the inner side surface of the recessed section 459 opposed to the first detection electrode 421b. It should be noted that the second detection electrode 422a and the first detection electrode 421a disposed on the inner side surfaces of the recessed section 459, and the first detection electrode 421b and the second detection electrode 422b disposed on the inner side surfaces of the recessed section 459 are separated by the respective bottom surfaces of the recessed sections 459.

Due to the configuration of the first detection electrodes 421a, 421b and the second detection electrodes 422a, 422b in the first detection vibrating arm 421 and the second detection vibrating arm 422, it becomes possible to use the simple device, which the plane exposure, for forming the electrode separation sections 403m, 403n using the exposure, and it is possible to easily perform the exposure (the resist exposure) for forming the separation sections for separating the electrodes. In other words, the electrode separation sections 403m, 403n can easily be formed.

Further, as shown in FIG. 6A, the first and second support sections 51, 52 each extend along the X-axis direction, and the vibrating body 4 is located between the first and second support sections 51, 52. In other words, the first and second support sections 51, 52 are arranged so as to be opposed to each other along the Y-axis direction across the vibrating body 4. The first support section 51 is connected to the base section 41 via the first beam 61 and the second beam 62, and the second support section 52 is connected to the base section 41 via the third beam 63 and the fourth beam 64.

The first beam 61 passes between the first detection vibrating arm 421 and the first drive vibrating arm 441, and connects the first support section 51 and the base section 41 to each other, the second beam 62 passes between the first detection vibrating arm 421 and the third drive vibrating arm 443, and connects the first support section 51 and the base section 41 to each other, the third beam 63 passes between the second detection vibrating arm 422 and the second drive vibrating arm 442, and connects the second support section 52 and the base section 41 to each other, and the fourth beam 64 passes between the second detection vibrating arm 422 and the fourth drive vibrating arm 444, and connects the second support section 52 and the base section 41 to each other.

The first through fourth beams 61 through 64 are each formed to have an elongated shape having a meandering portion extending along the Y-axis direction while reciprocating along the X-axis direction, and are therefore provided with elasticity in all directions. Therefore, even in the case in which an impact is externally applied, the beams 61, 62, 63, and 64 have a function of absorbing the impact, and therefore, the detection noise due to the impact can be reduced or inhibited.

The gyro element 400 having such a configuration as described above detects the angular velocity ω around the Z axis in such a manner as described below. In the gyro element 400, when an electric field is generated between the drive signal electrode (not shown) and the drive ground electrode (not shown) in the state in which no angular velocity ω is applied, the drive vibrating arms 441, 442, 443, and 444 flexurally vibrate in the X-axis direction. On this occasion, since the first and second drive vibrating arms 441, 442, and the third and fourth drive vibrating arms 443, 444 perform the vibrations plane-symmetrical with each other about the Y-Z plane passing through the center point (the centroid), the base section 41, the first and second connection arms 431, 432, and the first and second detection vibrating arms 421, 422 hardly vibrate.

In the state in which the drive vibration described above is performed, when the angular velocity ω around the Z axis is applied to the gyro element 400, the Coriolis force in the Y-axis direction acts on the drive vibrating arms 441, 442, 443, and 444, and the connection arms 431, 432, and the detection vibration in the X-axis direction is excited in accordance with the vibration in the Y-axis direction. Then, by detecting the distortion of the detection vibrating arms 421, 422 generated by the vibration as the detection signal, the angular velocity ω can be obtained.

According to the gyro element 400 related to the fourth embodiment described above, it becomes possible to form the electrodes separated into the obverse surface 403c side and the reverse surface 403d side on the side surfaces 403h, 403i and in the recessed sections (grooves) 458, 459 using the simple device, which uses the plane exposure, as in the case of the first detection electrodes 421a, 421b and the second detection electrodes 422a, 422b in the first detection vibrating arm 421 and the second detection vibrating arm 422. Thus, it becomes possible to use the simple device, which uses the plane exposure, for forming the electrode separation sections 403m, 403n using the exposure in the side surfaces 403h, 403i. Further, at the same time, it is possible to perform the exposure (resist exposure) for forming the electrode separation sections (not shown) between the first detection electrodes 421a, 421b and the second detection electrodes 422a, 422b located inside the recessed sections (grooves) 458, 459 on the bottom surfaces of the recessed sections (grooves) 458, 459. As described above, the exposure (resist exposure) for the electrode separation on the side surfaces 403h, 403i and in the recessed sections (the grooves) 458, 459 can easily be performed. In other words, it becomes possible to easily form the gyro element 400 having the electrode separation sections 403m, 403n at low cost.

It should be noted that although in the gyro element 400 related to the fourth embodiment, the explanation is presented using the configuration in which the first detection vibrating arm 421 and the second detection vibrating arm 422 are provided with the recessed sections 458, 459, the invention is not limited to this configuration, but it is possible to adopt a configuration not provided with the recessed sections 458, 459.

Modified Example of Detection Arm

Hereinafter, modified examples of the side surface shape in the vibrating arm will be explained with reference to FIGS. 7A through 7D. FIGS. 7A through 7D are diagrams each showing an example of the side surface shape of the vibrating arms, and are cross-sectional views corresponding to the cross-sectional surface in the C-C line of FIG. 3B. It should be noted that in the present explanation, the constituents substantially the same as those of the third embodiment described above will be denoted with the same reference symbols, and the explanation thereof will be omitted. Further, although in the present explanation, the examples corresponding to the detection vibrating arm 3a of the third embodiment described above are described, the side surface shapes related to the present modified examples are not limited to those of the detection vibrating arms. Further, although in each of the explanations, the configuration of one side surface 3h, 3i is explained as a representative example, substantially the same configurations are respectively provided to the both side surfaces. Further, in the following modified examples, the grooves are omitted from the description including the drawings.

Figure 7A:
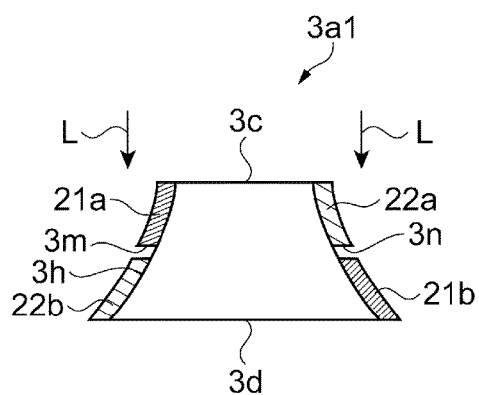
FIGS. 7A through 7D are cross-sectional views each showing a modified example of a side surface shape of a vibrating arm.

The detection vibrating arm 3a1 of Modified Example 1 shown in FIG. 7A is provided with the side surface 3h formed of a curve having a concave shape, which is exposed and can visually be recognized when viewed from the obverse surface 3c direction. In other words, the side surface 3h has a surface, which can directly be irradiated with the irradiation light L as parallel light for the exposure from the obverse surface 3c direction. The electrode separation section 3m is disposed on the side surface 3h at the position, which can visually be recognized when viewed from the obverse surface 3c direction. Further, on the side surface 3h, there are disposed the first detection electrode 21a and the second detection electrode 22b separated by the electrode separation section 3m. It should be noted that as the configuration of the side surface it is also possible to adopt a side surface (the tilted section) having a configuration including a curve of a convex surface instead of the configuration of the curve having the concave shape in Modified Example 1, further, it is also possible to adopt a configuration including a straight line and a curve mixed with each other.

Figure 7B:
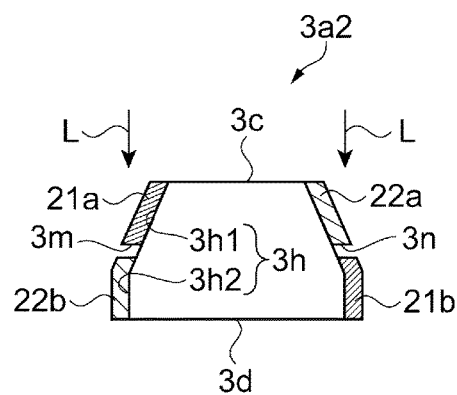

The detection vibrating arm. 3a2 of Modified Example 2 shown in FIG. 7B is provided with the side surface 3h constituted by a tilted section 3h1, which is exposed and can visually be recognized when viewed from the obverse surface 3c direction, and a surface 3h2 extending along the direction (the Z-axis direction) viewed from the obverse surface 3c direction. The tilted section 3h1 can directly be irradiated with the irradiation light L as the parallel light for the exposure from the obverse surface 3c direction, and the electrode separation section 3m is disposed on the tilted section 3h1. Further, on the side surface 3h, there are disposed the first detection electrode 21a and the second detection electrode 22b separated by the electrode separation section 3m. Even in the configuration in which the side surface 3h includes two planes combined with each other as described above, it is sufficient to be provided with the surface such as the tilted section 3h1 exposed when viewed from the obverse surface 3c direction.

Figure 7C:
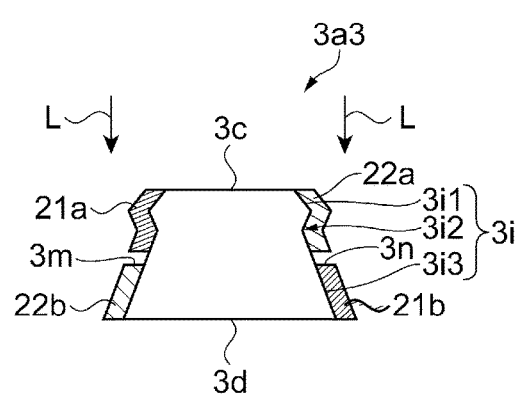

The detection vibrating arm 3a3 of Modified Example 3 shown in FIG. 7C is provided with the side surface 3i having a configuration in which a convex section 3i1 having a central portion shaped like a projection and the tilted section 3i3, which is exposed and can visually be recognized when viewed from the obverse surface 3c direction, are respectively disposed on the obverse surface 3c side and the reverse surface 3d side via a constricted section 3i2. The tilted section 3i3 can directly be irradiated with the irradiation light L as the parallel light for the exposure from the obverse surface 3c direction, and the electrode separation section 3n is disposed on the tilted section 3i3. Further, on the side surface 3i, there are disposed the second detection electrode 22a and the first detection electrode 21b separated by the electrode separation section 3n. Even in the configuration in which the side surface 3i is provided with a projection such as the convex section 3i1, it is sufficient to be provided with a surface such as the tilted section 3i3 exposed when viewed from the obverse surface 3c direction.

Figure 7D:
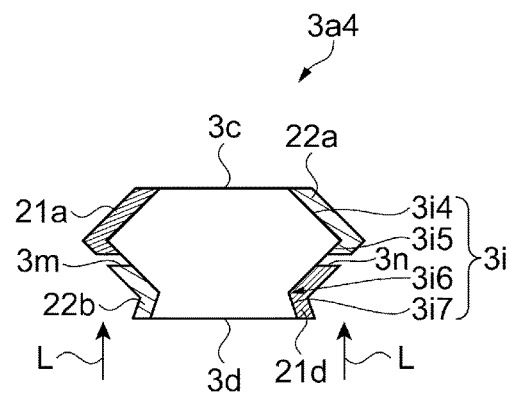

The detection vibrating arm 3a4 of Modified Example 4 shown in FIG. 7D is provided with the side surface 3i constituted by a tilted section 3i4 facing toward (exposed to) the obverse surface 3c, a tilted section 3i5 facing toward (exposed to) the reverse surface 3d, and a tilted section 3i7 connected to the tilted section 3i5 via a constricted section 3i6. In the side surface 3i having this configuration, the tilted section 3i4 is exposed and can visually be recognized when viewed from the obverse surface 3c direction, and the tilted section 3i5 is exposed and can visually be recognized when viewed from the reverse surface 3d direction. In the present example, as shown in FIG. 7D, there is shown a configuration of applying the irradiation light L as the parallel light for the exposure from the reverse surface 3d side. Therefore, in the configuration of the detection vibrating arm 3a4 of the modified example 4, the electrode separation section 3n is disposed in the tilted section 3i5.

As described above, if the tilted sections respectively facing toward both of the surfaces, namely the obverse surface 3c and the reverse surface 3d, are provided, by disposing the position of the electrode separation section 3n in the tilted sections, it is possible to form the electrode separation section 3n by applying the irradiation light L as the parallel light for the exposure from either of the obverse surface 3c side and the reverse surface 3d side.

In Modified Example 1 through Modified Example 4 described above, the electrode separation section 3m, 3n can visually be recognized when viewed from the plane, and it is possible to directly irradiate the tilted section (the side surface 3h, 3i) with the light in the exposure process when forming the electrode separation section 3m, 3n by using the so-called plane exposure of irradiating the obverse surface 3c or the reverse surface 3d of the detection vibrating arm 3a1, 3a2, 3a3, or 3a4. As described above, in the exposure of the tilted sections, it is possible to use the plane exposure of irradiating the tilted sections with the parallel light from the same direction, and thus it becomes possible to use the simple device, which uses the plane exposure. Thus, it is possible to easily perform the exposure (resist exposure) for forming the electrode separation section 3m, 3n for separating the first detection electrodes 21a, 21b or the second detection electrodes 22a, 22b constituting the detection electrodes.

It should be noted that in the vibrating arm provided with the side surfaces respectively having the tilted sections, it is preferable to make the shapes (the tilt angles) of the tilted sections line-symmetric with respect to the center line in the width direction (the X-axis direction) of the vibrating arm. By making the shapes (the tilt angles) of the tilted sections line-symmetric as described above, it becomes possible to improve the vibration characteristics and at the same time stabilize the vibration characteristics.

Method of Manufacturing Vibrator Element

Figure 8:
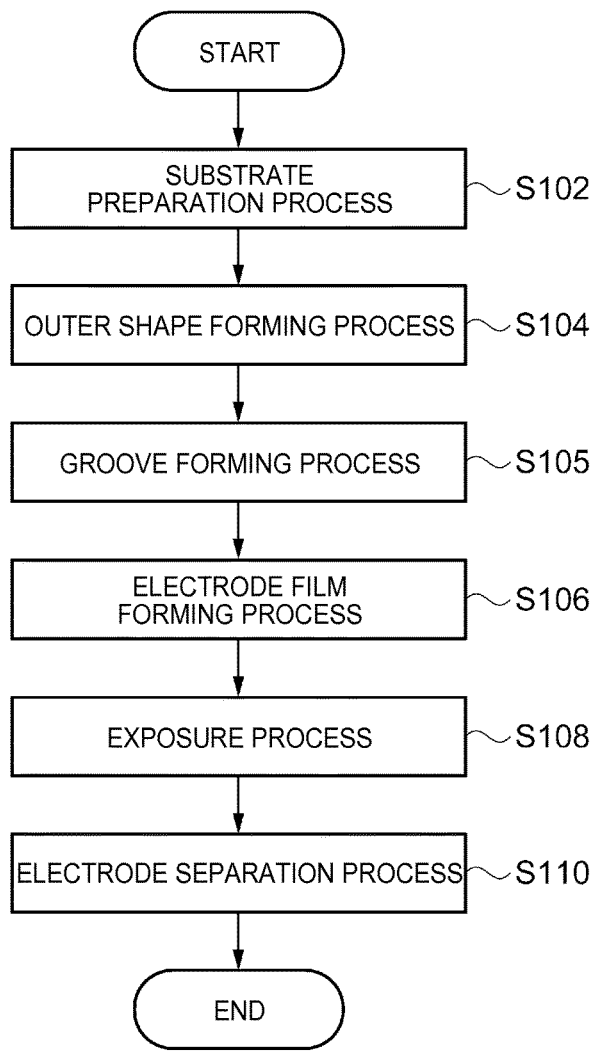
FIG. 8 is a flowchart showing an outline of a manufacturing process of the vibrator element according to an embodiment of the invention.

Then, an outline of a method of manufacturing the vibrator element will be explained with a focus on an outer shape forming process and an electrode forming process with reference to FIG. 8. FIG. 8 is a process flowchart showing an outline of a manufacturing process of the vibrator element according to an embodiment of the invention. In the present explanation, a tuning fork vibrating element 100 as a tuning fork vibrator element according to the first embodiment will be explained as an example. Therefore, the same constituents and the same symbols as those shown in FIGS. 1A and 1B appear in the explanation.

In the method of manufacturing the tuning fork vibrating element 100, there are included a substrate preparation process S102 for forming the quartz crystal Z plate, an outer shape forming process S104 for forming the outer shape of the tuning fork vibrating element 100, a groove forming process S105 for providing the grooves to the vibrating arms (e.g., drive vibrating arms 120, 130), an electrode film forming process S106 for forming electrode films on exposed surfaces of the substrate, an exposure process S108 for exposing the resist for separating the electrode films into predetermined shapes, and an electrode separation process S110 for forming the electrodes.

Firstly, in the substrate separation process S102, a process such as polishing process is performed on the substrate formed of the so-called quartz crystal Z plate carved out along a plane defined by the X axis and the Y axis perpendicular to each other in the quartz crystal axes to prepare the quartz crystal substrate formed of the Z plate.

Then, in the outer shape forming process S104, predetermined masking is performed on the quartz crystal substrate prepared in the substrate preparation process S102 using metal films or the like, and then the outer circumferential shape of the tuning fork vibrating element 100 is formed using a dry etching method using a fluorine gas. On this occasion, the outer shape including the side surfaces of the vibrating arms (e.g., the drive vibrating arms 120, 130) constituting the tuning fork vibrating element 100 is formed so as to include the tilted sections exposed so as to be able to visually be recognized when viewed from the obverse surface 103c, 103g side. By forming the outer shape using the dry etching method as described above, the tilted sections can easily be formed. Further, the outer shape can be formed with high dimensional accuracy.

Subsequently, in the groove forming process S105, the recessed sections (the grooves) 148, 158 are formed on the obverse surface side and the reverse surface side of each of the vibrating arms (e.g., the drive vibrating arms 120, 130). In the groove forming process S105, for example, predetermined masking is performed on the quartz crystal surface having been provided with the outer shape using metal films or the like, and then the recessed sections (the grooves) 148, 158 can be formed using a dry etching method using a fluorine gas.

Subsequently, in the electrode film forming process S106, a metal film is formed on the entire exposed surfaces of the quartz crystal substrate having been provided with the outer shape of the tuning fork vibrating element 100 using a sputtering method. The metal film turns the respective electrodes later. Specifically, the metal film forms groove electrode films on the inner surfaces of the recessed sections (grooves) 148, 158, and forms side surface electrode films on the side surfaces 103h, 103i, 103j, and 103k.

Subsequently, in the exposure process S108, a photoresist layer is formed on the surface of the metal film. Subsequently, an exposure treatment of irradiating the photoresist layer located in a part corresponding to a part where no electrode is formed with light, and a development treatment are performed to remove the photoresist layer located in the part thus exposed. In the exposure process S108, the outer shape including the side surfaces 103h, 103i, 103j, and 103k of the vibrating arms (e.g., the drive vibrating arms 120, 130) includes the tilted sections exposed so as to be able to visually be recognized when viewed from the obverse surface 103c, 103g side, and the parts where no electrode is formed, namely the electrode separation sections 103m, 103n, 103r, and 103s, are disposed on the tilted sections. Thus, even by using the so-called plane exposure for irradiating the obverse surfaces 103c, 103g and the reverse surfaces 103d, 103f of the drive vibrating arms 120, 130 with the light for the exposure, it is possible to directly irradiate the tilted sections (the side surfaces 103h, 103i, 103j, and 103k) with the light. Further, it is possible to irradiate the bottom surfaces in the recessed sections (the grooves) 148, 158 with the light for the exposure. As described above, in the exposure of the recessed sections (the grooves) 148, 158 and the tilted sections, it is possible to use the plane exposure of irradiating the tilted sections with the parallel light from the same direction. Therefore, the simple device, which uses the plane exposure, can be used.

Subsequently, in the electrode separation process S110, the metal film corresponding to the parts where the photoresist layer has been removed is removed by a wet etching method using the remaining photoresist layer as the mask to thereby divide the metal film. Due to the dividing process, the electrodes (the electrode pattern) are formed. Further, by removing the remaining photoresist layer, the electrodes of the tuning fork vibrating element 100 can be formed. According to the process described hereinabove, the tuning fork vibrating element 100 can be formed.

Gyro Sensor as Electronic Device

Figure 9:
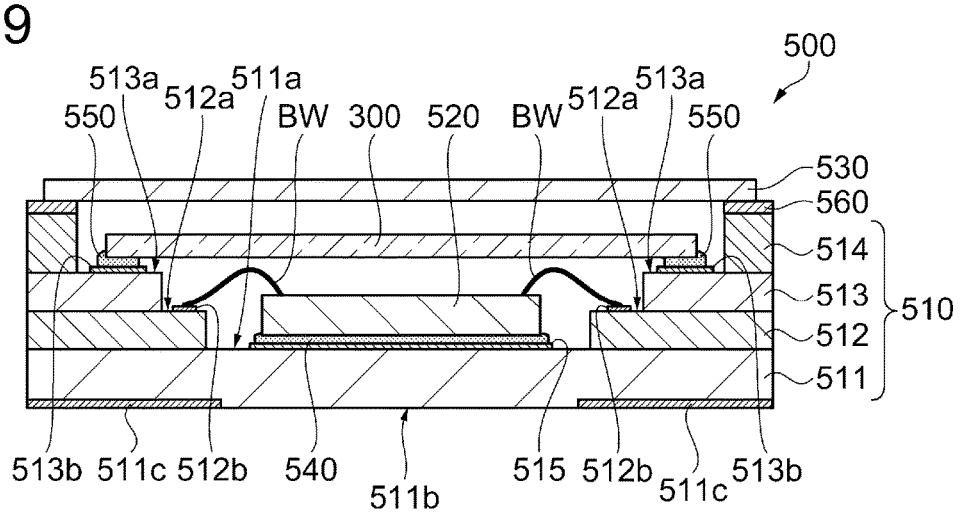
FIG. 9 is a front cross-sectional view showing a schematic configuration of a gyro sensor as an example of an electronic device according to the invention.

Then, the gyro sensor as the electronic device equipped with the gyro element 300 according to the third embodiment will be explained with reference to FIG. 9. FIG. 9 is a front cross-sectional view showing an outline of the gyro sensor as an example of the electronic device.

As shown in FIG. 9, the gyro sensor 500 has the gyro element 300 and a semiconductor device 520 as an electronic component housed in a recessed section of a package 510. An opening section of the package 510 is sealed with a lid member 530 to thereby keep the inside of the package 510 airtight. As shown in FIG. 9, the package 510 is formed of a first substrate 511 having a plate-like shape, and a second substrate 512, a third substrate 513, and a fourth substrate 514 each having a frame-like shape, stacked sequentially on the first substrate 511, and fixed to each other to thereby form the recessed section in which the semiconductor 520 and the gyro element 300 are housed. The substrates 511, 512, 513, and 514 are each formed of, for example, ceramics.

In the first substrate 511, a die pad 515, which the semiconductor device 520 is mounted on and is then fixed to, is disposed on an electronic component installation surface 511a, which is located on the recessed section side, and on which the semiconductor device 520 is mounted. The semiconductor device 520 is bonded to the surface of the die pad 515 with, for example, brazing filler material (die attaching material) 540, to thereby be fixed to the die pad 515.

The semiconductor device 520 has a drive circuit as an excitation device for driving the gyro element 300 to vibrate, and a detection circuit as a detector for detecting the detection vibration caused in the gyro element 300 upon application of the angular velocity. Specifically, the drive circuit provided to the semiconductor device 520 supplies the drive signals to the drive electrodes 11a, 11b, and 12c, and the drive electrodes 11c, 12a, and 12b (see FIG. 5B) respectively provided to the pair of drive vibrating arms 2a, 2b (see FIG. 5B) of the gyro element 300. Further, the detection circuit provided to the semiconductor device 520 makes the detection signal generated in the detection electrodes 21a, 21b, 22a, and 22b and the detection electrodes 31a, 31b, 32a, and 32b respectively provided to the pair of detection vibrating arms 3a, 3b (see FIG. 5A) of the gyro element 300 be amplified to thereby generate an amplified signal, and then detects the rotational angular velocity applied to the gyro sensor 500 based on the amplified signal.

The second substrate 512 is formed to have a frame-like shape having an opening with a size sufficient for housing the semiconductor device 520 mounted on the die pad 515. The third substrate 513 is formed to have a frame-like shape having an opening larger than the opening of the second substrate 512, and is stacked on the second substrate 512 and fixed thereto. Further, a second substrate surface 512a appears inside the opening of the third substrate 513 when the third substrate 513 is stacked on the second substrate 512, and a plurality of IC connection terminals 512b is formed on the second substrate surface 512a. To the plurality of IC connection terminals 512b, there are connected bonding wires BW electrically connected to electrode pads not shown of the semiconductor device 520. Further, the electrode pads not shown of the semiconductor device 520 and the IC connection terminals 512b provided to the package 510 are electrically connected to each other using a wire bonding method. In other words, the plurality of electrode pads provided to the semiconductor device 520 and the corresponding IC connection terminals 512b of the package 510 are connected to each other with the bonding wires BW. Further, some of the IC connection terminals 512b are electrically connected to a plurality of external connection terminals 511c disposed on an external bottom surface 511b of the first substrate 511 with internal wiring lines not shown of the package 510.

On the third substrate 513, there is stacked the fourth substrate 514 having an opening larger than the opening of the third substrate 513, and is fixed thereto. Further, a third substrate surface 513a appears inside the opening of the fourth substrate 514 when the fourth substrate 514 is stacked on the third substrate 513, and a plurality of gyro element connection terminals 513b is formed on the third substrate surface 513a. The plurality of gyro element connection terminals 513b is connected to the connection pads (not shown) provided to the gyro element 300. The gyro element connection terminals 513b are electrically connected to corresponding ones of the IC connection terminals 512b with internal wiring lines not shown of the package 510. The gyro element 300 is mounted on the third substrate surface 513a so that the first support section 5b and the second support section 6b (see FIGS. 3A and 3B) of the gyro element 300 are aligned with the connection pads and the gyro element connection terminals 513b, and is bonded to be fixed thereto with an electrically conductive adhesive 550.

Further, the lid member 530 is disposed on the upper surface of the opening section of the fourth substrate 514 to thereby seal the opening of the package 510, and thus the inside of the package 510 is sealed airtightly, and the gyro sensor 500 can be obtained. The lid member 530 can be formed using, for example, metal such as "42 alloy" (an iron-nickel alloy containing nickel 42%) or kovar (an alloy of iron, nickel, and cobalt), ceramics, or glass. For example, in the case of forming the lid member 530 with the metal, the lid member 530 is bonded to the package 510 by performing seam welding via a seal ring 560 formed by die-cutting the kovar alloy and so on so as to have a rectangular-ring shape. The recessed section space formed by the package 510 and the lid member 530 forms a space for the gyro element 300 to act, and is therefore preferably sealed airtightly to create a reduced-pressure space or an inert gas atmosphere.

According to the gyro sensor 500 as the electronic device, since there is provided the low-cost gyro element 300 in which the first detection electrodes 21a, 21b and the second detection electrodes 22a, 22b can be formed using the simple device which uses the plane exposure, it is possible to make the gyro sensor 500 low in cost. Further, the package type gyro sensor 500 having the configuration described above is advantageous to the miniaturization and thickness reduction, and at the same time, has an improved impact resistance.

It should be noted that as the electronic device to which the vibrator element according to the invention can be applied, there can be cited, for example, a vibrator as a timing device housing the vibrator element in the package, an oscillator as a timing device housing the vibrator element and the circuit element provided with at least a function of vibrating the vibrator element in the package, and so on, besides the gyro sensor 500.

Electronic Apparatus

Figure 10A:
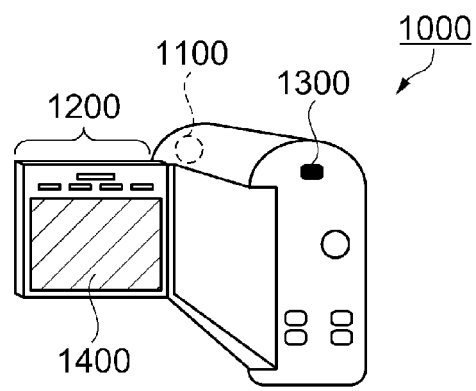
FIGS. 10A through 10C are perspective views each showing an example of an electronic apparatus equipped with the vibrator element according to the invention.
Figure 10B:
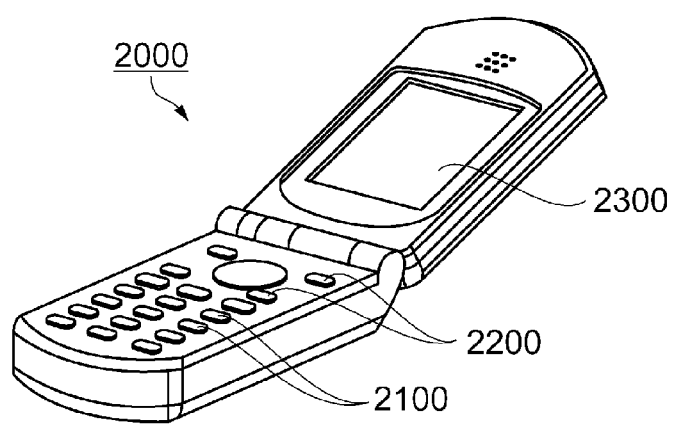
Figure 10C:
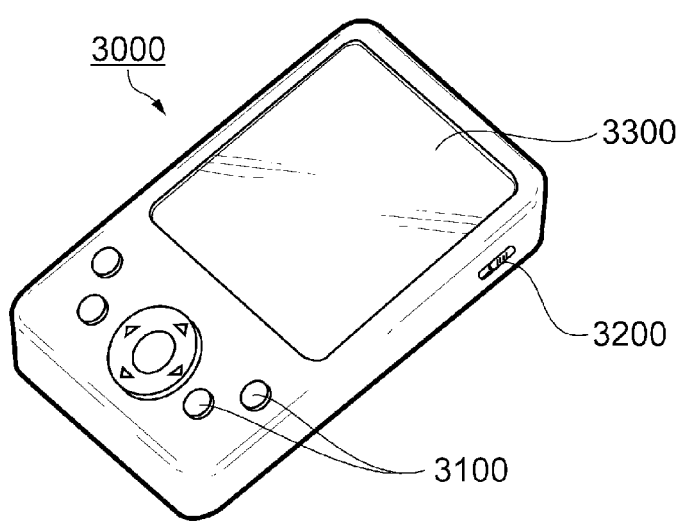

Then, an electronic apparatus equipped with the vibrator element according to any of the embodiments described above will be explained with reference to FIGS. 10A through 10C. It should be noted that in the following explanation, there is explained an example using the gyro element 300 as an example of the vibrator element. FIGS. 10A through 10C are perspective views each showing an example of an electronic apparatus equipped with the gyro element 300.

FIG. 10A shows an example in which the gyro element 300 is applied to a digital video camera 1000 as the electronic apparatus. The digital video camera 1000 is provided with an image reception section 1100, an operation section 1200, a sound input section 1300, and a display unit 1400. It is possible to provide such a digital video camera 1000 with an image stabilization function equipped with the gyro element 300 according to the embodiment described above.

FIG. 10B shows an example in which the gyro element 300 is applied to a cellular phone 2000 as the electronic apparatus. The cellular phone 2000 shown in FIG. 10B is provided with a plurality of operation buttons 2100 and scroll buttons 2200, and a display unit 2300. By operating the scroll buttons 2200, the screen displayed on the display unit 2300 is scrolled.

FIG. 10C shows an example in which the gyro element 300 is applied to a personal digital assistant (PDA) 3000 as the electronic apparatus. The PDA 3000 shown in FIG. 10C is provided with a plurality of operation buttons 3100, a power switch 3200, and a display unit 3300. When operating the power switch 3200, a variety of types of information such as an address list or a date book are displayed on the display unit 3300.

By implementing the gyro element 300 according to the embodiments described above to such a cellular phone 2000 and such a PDA 3000, a variety of functions can be provided thereto. For example, in the case of providing the cellular phone 2000 shown in FIG. 10B with a camera function not shown, it is possible to perform the image stabilization similarly to the digital video camera 1000 described above. Further, in the case of providing the cellular phone 2000 shown in FIG. 10B or the PDA 3000 shown in FIG. 10C with the global positioning system (GPS) widely known to the public, the position and the attitude of the cellular phone 2000 or the PDA 3000 can be made to be recognized using the GPS by installing the gyro element 300 according to any one of the embodiments described above.

It should be noted that, the vibrator element including the gyro element 300 according to the embodiment of the invention as an example can also be applied to an electronic apparatus such as an inkjet ejection device (e.g., an inkjet printer), a laptop personal computer, a television set, a video camera, a video recorder, a car navigation system, a pager, an electronic organizer (including one with a communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), and a flight simulator besides the digital video camera 1000 shown in FIG. 10A, the cellular phone shown in FIG. 10B, and the personal digital assistant shown in FIG. 10C.

Moving Object

Figure 11:
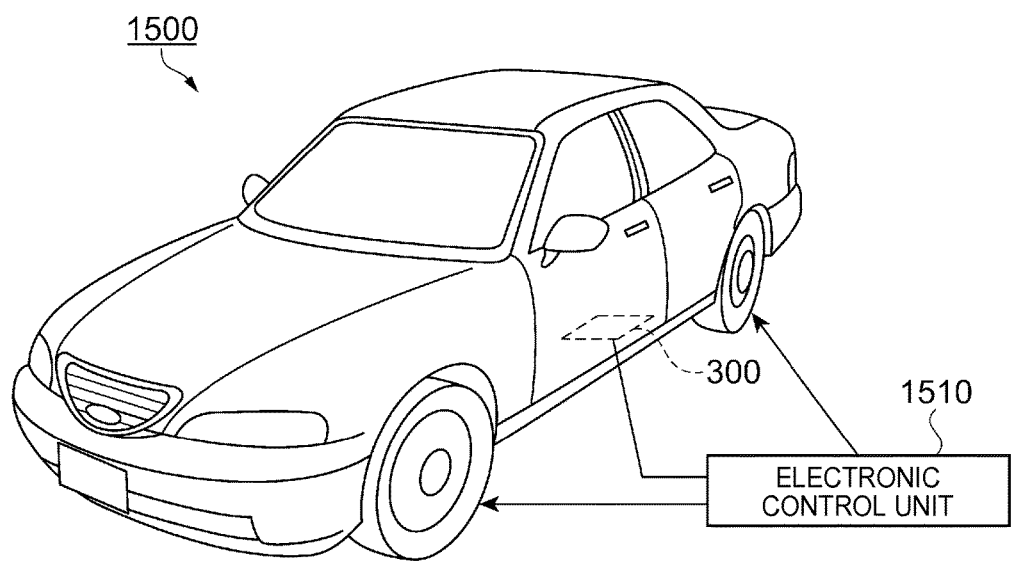
FIG. 11 is a perspective view showing a vehicle as a mobile object equipped with the vibrator element according to the invention.

Then, a moving object equipped with the vibrator element according to any of the embodiments described above will be explained. It should be noted that in the following explanation, there is explained an example using the gyro element 300 as an example of the vibrator element. FIG. 11 is a perspective view schematically showing a vehicle as an example of the moving object. The vehicle 1500 is equipped with the gyro element 300 according to the third embodiment. For example, as shown in the drawing, in the vehicle 1500 as the moving object, an electronic control unit 1510 incorporating the gyro element 300 and for controlling tires and so on is installed in a vehicle body. Further, besides the above, the gyro element 300 can widely be applied to an electronic control unit (ECU) such as a keyless entry system, an immobilizer, a car navigation system, a car air-conditioner, an anti-lock braking system (ABS), an air-bag system, a tire pressure monitoring system (TPMS), an engine controller, a battery monitor for a hybrid car or an electric car, or a vehicle attitude control system.

Although the embodiments of the invention are hereinabove explained specifically, the invention is not limited to the embodiments described above, but can variously be modified within the scope or the spirit of the invention. For example, although the example using quartz crystal as the constituent material of the vibrator element or the gyro element as the vibrator element is explained in the embodiments and the modified examples described above, a piezoelectric material other than quartz crystal can also be used. For example, there can be used aluminum nitride (AlN), an oxide substrate such as lithium niobate ($LiNbO_3$), lithium tantalate ($LiTaO_3$), lead zirconium titanate (PZT), lithium tetraborate ($Li_2B_4O_7$), or langasite ($La_3Ga_5SiO_{14}$), a multi-layer piezoelectric substrate formed by stacking a piezoelectric material such as aluminum nitride or tantalum pentoxide ($Ta_2O_5$) on a glass substrate, or piezoelectric ceramics. Further, the vibration element can be formed using a material other than the piezoelectric material. The vibration element can be formed using, for example, a silicon semiconductor material. Further, the vibration (drive) system of the vibration element is not limited to the piezoelectric drive system. The configuration of the invention and the advantages thereof can be exerted in the vibration element of an electrostatic actuator type using an electrostatic force, or a Lorentz drive type using a magnetic force besides the vibration element of the piezoelectric drive type using the piezoelectric substrate.

The entire disclosure of Japanese Patent Application No. 2014-220038, filed Oct. 29, 2014 is expressly incorporated by reference herein.

What is claimed is:

1. A vibrator element comprising:
   a base section; and
   vibrating arms extending from the base section, the vibrating arms including:
      an obverse surface;
      a reverse surface on an opposite side to the obverse surface;
      grooves provided respectively at the obverse surface and the reverse surface;
      side surface electrodes disposed on a side surface that connects the obverse surface and the reverse surface to each other, the side surface having a tilted section tilting toward the obverse surface in a planar view from an obverse surface side, and the side surface electrodes being separated from each other in the tilted section; and
      groove electrodes provided at the grooves.

2. The vibrator element according to claim 1, wherein
   the vibrating arms include at least one drive vibrating arm and at least one detection vibrating arm, and
   the detection vibrating arm is provided with detection electrodes as the side surface electrodes and the groove electrodes.

3. The vibrator element according to claim 2, wherein
   the detection vibrating arm extends from one end of the base section, and
   the drive vibrating arm extends from another end located on an opposite side to the one end of the base section in the planar view from the obverse surface side.

4. The vibrator element according to claim 2, further comprising:
   an adjusting vibrating arm extending from the base section that is located on a side of at least one of the detection vibrating arm and the drive vibrating arm.

5. The vibrator element according to claim 3, further comprising:
   an adjusting vibrating arm extending from the base section that is located on a side of at least one of the detection vibrating arm and the drive vibrating arm.

6. The vibrator element according to claim 2, further comprising:
   a large-width section disposed on one end of at least one of the drive vibrating arm and the detection vibrating arm, which is connected to the base section at the other end on the opposite side to the one end.

7. The vibrator element according to claim 3, further comprising:
   a large-width section disposed on one end of at least one of the drive vibrating arm and the detection vibrating arm, which is connected to the base section at the other end on the opposite side to the one end.

8. The vibrator element according to claim 4, further comprising:
   a large-width section disposed on one end of at least one of the drive vibrating arm, the detection vibrating arm, and the adjusting vibrating arm, which is connected to the base section at the other end on the opposite side to the one end.

9. The vibrator element according to claim 5, further comprising:
   a large-width section disposed on one end of at least one of the drive vibrating arm, the detection vibrating arm, and the adjusting vibrating arm, which is connected to the base section at the other end on the opposite side to the one end.

10. An electronic device comprising:
    the vibrator element according to claim 1;
    an electronic component including at least a drive circuit adapted to excite the vibrating arm; and a package adapted to house at least one of the vibrator element and the electronic component.

11. An electronic device comprising:
the vibrator element according to claim 3;
an electronic component including at least a drive circuit adapted to excite the vibrating arm; and
a package adapted to house at least one of the vibrator element and the electronic component.

12. An electronic device comprising:
the vibrator element according to claim 5;
an electronic component including at least a drive circuit adapted to excite the vibrating arm; and
a package adapted to house at least one of the vibrator element and the electronic component.

13. An electronic apparatus comprising:
the vibrator element according to claim 1.

14. An electronic apparatus comprising:
the vibrator element according to claim 3.

15. An electronic apparatus comprising:
the vibrator element according to claim 5.

16. A moving object comprising:
the vibrator element according to claim 1.

17. A moving object comprising:
the vibrator element according to claim 3.

18. A moving object comprising:
the vibrator element according to claim 5.

* * * * *